United States Patent
Nakayama et al.

(10) Patent No.: US 10,094,862 B2
(45) Date of Patent: Oct. 9, 2018

(54) SOUND PROCESSING DEVICE AND SOUND PROCESSING METHOD

(71) Applicant: FUJITSU LIMITED, Kawasaki-shi, Kanagawa (JP)

(72) Inventors: Sayuri Nakayama, Kawasaki (JP); Taro Togawa, Kawasaki (JP); Takeshi Otani, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/645,011

(22) Filed: Jul. 10, 2017

(65) Prior Publication Data
US 2018/0059155 A1 Mar. 1, 2018

(30) Foreign Application Priority Data
Aug. 30, 2016 (JP) .................................. 2016-168045

(51) Int. Cl.
*G01R 23/10* (2006.01)
*G10L 19/02* (2013.01)
(Continued)

(52) U.S. Cl.
CPC .............. *G01R 23/16* (2013.01); *G10L 19/02* (2013.01); *G10L 21/0232* (2013.01); *H03G 3/32* (2013.01);
(Continued)

(58) Field of Classification Search
CPC ........ G10R 23/16; G10K 19/02; H04H 60/04; H04R 1/22; G10L 19/02; G10L 21/0232;
(Continued)

(56) References Cited

U.S. PATENT DOCUMENTS

2005/0216258 A1* 9/2005 Kobayashi .............. H04M 3/56
704/205
2009/0323977 A1 12/2009 Kobayashi et al.
(Continued)

FOREIGN PATENT DOCUMENTS

JP 02-230895 9/1990
JP 2004-078021 3/2004
(Continued)

OTHER PUBLICATIONS

Bland, Health Sciences M.Sc.Programme Applied Biostatics, 2006, p. 1-3.*
(Continued)

*Primary Examiner* — Sonia Gay
(74) *Attorney, Agent, or Firm* — Fujitsu Patent Center

(57) ABSTRACT

A sound processing device performs obtaining a first frequency spectrum that corresponds to a first sound signal and a second frequency spectrum that corresponds to a second sound signal, calculating a level difference between a level of each of frequency components in the first frequency spectrum and a level of each of frequency components in the second frequency spectrum, calculating a spread of a distribution of the level difference during a prescribed period for each of the frequency components, and determining a gain to be multiplied to the frequency component in the first frequency spectrum and a gain to be multiplied to the frequency component in the second frequency spectrum in accordance with the spread of the distribution of the level difference.

19 Claims, 18 Drawing Sheets

(51) Int. Cl.
*G10L 21/0232* (2013.01)
*G10L 21/0208* (2013.01)
*G10L 21/0216* (2013.01)
*H03G 3/32* (2006.01)
*H03G 5/16* (2006.01)
*H04H 60/04* (2008.01)
*H04R 1/22* (2006.01)
*H04R 3/00* (2006.01)
*G01R 23/16* (2006.01)

(52) U.S. Cl.
CPC ............ *H03G 5/165* (2013.01); *H04H 60/04* (2013.01); *H04R 1/222* (2013.01); *H04R 3/005* (2013.01); *G10L 2021/02087* (2013.01); *G10L 2021/02165* (2013.01); *H04R 2430/03* (2013.01)

(58) Field of Classification Search
CPC ........... G10L 2021/02087; G10L 2021/02165; H03G 3/32; H03G 5/165
See application file for complete search history.

(56) References Cited

U.S. PATENT DOCUMENTS

| | | | |
|---|---|---|---|
| 2012/0308039 | A1 | 12/2012 | Kobayashi et al. |
| 2014/0376744 | A1* | 12/2014 | Hetherington ........... H03G 3/20 381/94.2 |
| 2017/0229137 | A1* | 8/2017 | Osako ................. G10L 21/0232 |

FOREIGN PATENT DOCUMENTS

| | | |
|---|---|---|
| JP | 2006-197552 | 7/2006 |
| JP | 2007-74665 A | 3/2007 |
| JP | 2014-72708 A | 4/2014 |

OTHER PUBLICATIONS

Partial European Search Report dated Sep. 1, 2017 for corresponding European Patent Application No. 17180231.7, 14 pages.

* cited by examiner

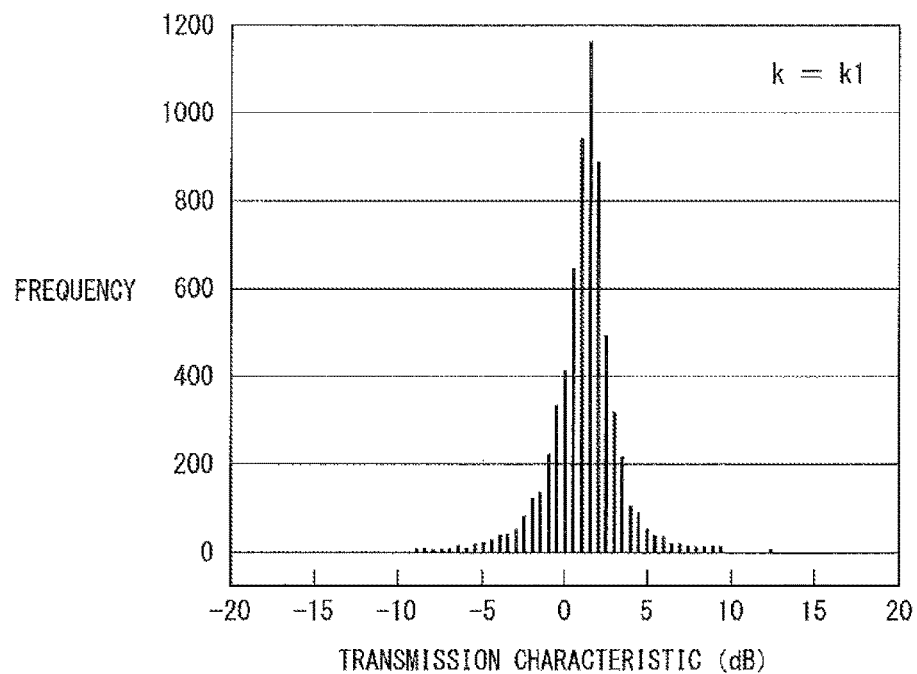
F I G. 6A
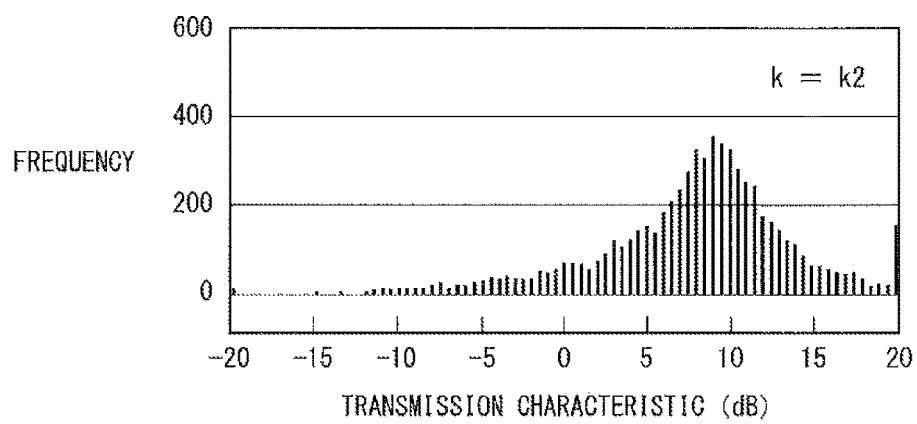
F I G. 6B

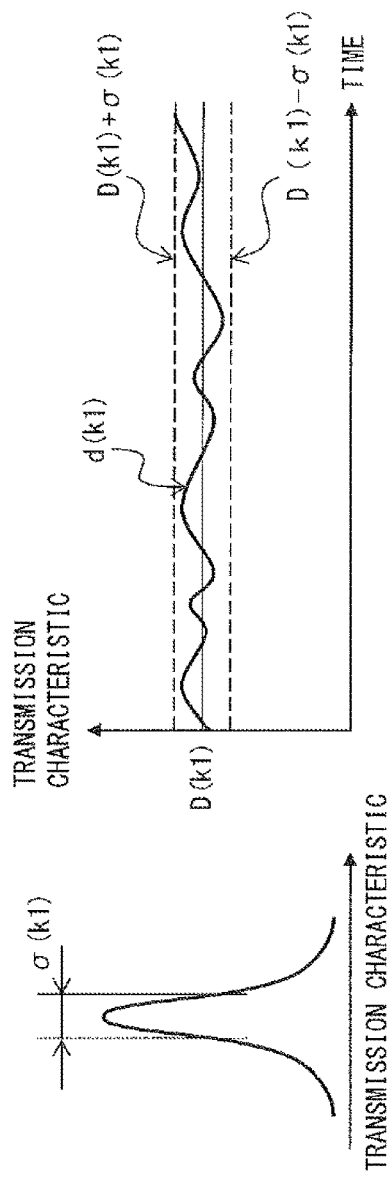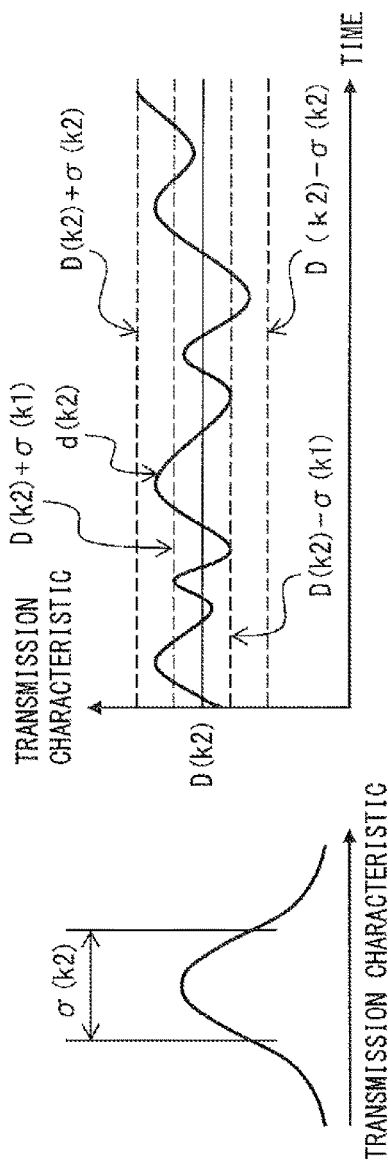
FIG. 7A
FIG. 7B
FIG. 7C
FIG. 7D

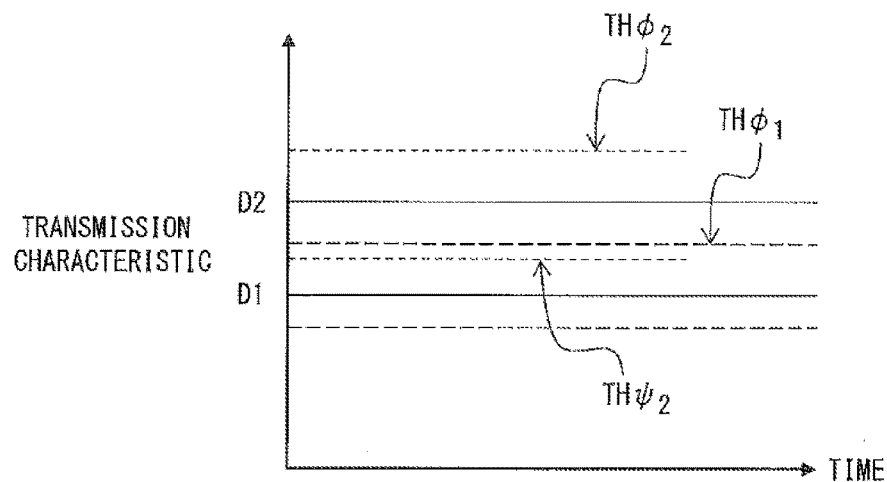
F I G. 1 6 A
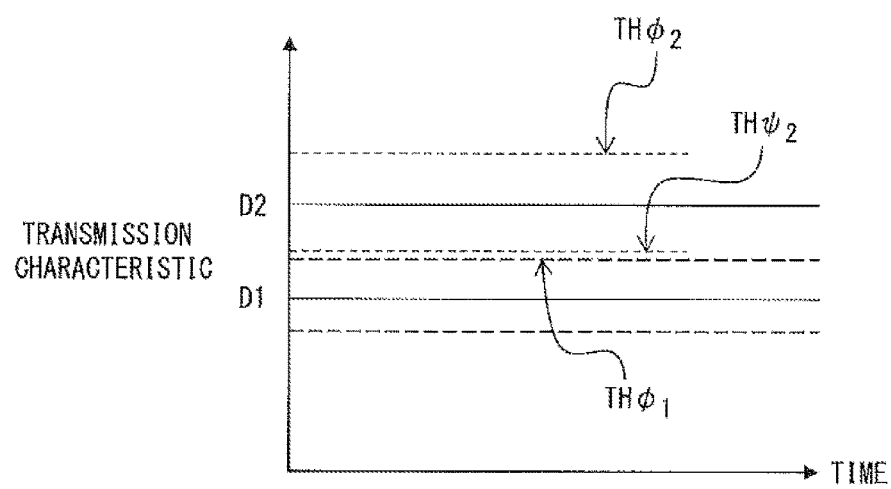
F I G. 1 6 B

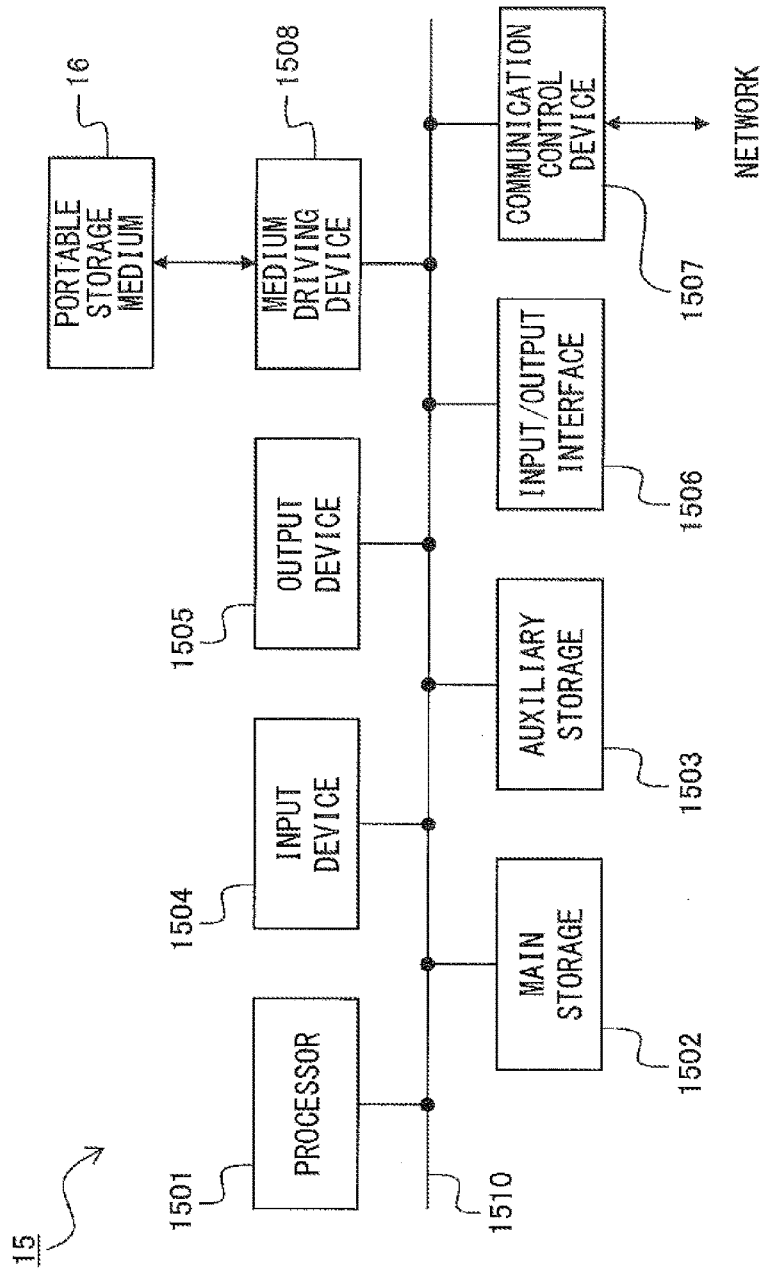
F I G. 17

SOUND PROCESSING DEVICE AND SOUND PROCESSING METHOD

CROSS-REFERENCE TO RELATED APPLICATION

This application is based upon and claims the benefit of priority of the prior Japanese Patent Application No. 2016-168045, filed on Aug. 30, 2016, the entire contents of which are incorporated herein by reference.

FIELD

The embodiments discussed herein are related to sound processing device, and sound processing method.

BACKGROUND

As one example of a sound processing technology for sound signals collected by a sound collection device, a technology for separating a sound source by using a transmission characteristic is known. In this type of technology, a transmission characteristic is estimated on the basis of a sound signal in a state in which only a sound source that is a sound collection target emits sound, and a component of a sound source other than the sound source that is a sound correction target, the component being included in a sound signal to be processed, is suppressed in accordance with the estimated transmission characteristic (for example, Japanese Laid-open Patent Publication No. 2006-197552).

SUMMARY

According to an aspect of the embodiment, a non-transitory computer-readable recording medium having stored therein a sound processing program that causes a computer to execute a sound process, the sound process includes obtaining a first frequency spectrum that corresponds to a first sound signal and a second frequency spectrum that corresponds to a second sound signal, calculating a level difference between a level of each of frequency components in the first frequency spectrum and a level of each of frequency components in the second frequency spectrum, calculating a spread of a distribution of the level difference during a prescribed period for each of the frequency components, and determining a gain to be multiplied to the frequency component in the first frequency spectrum and a gain to be multiplied to the frequency component in the second frequency spectrum in accordance with the spread of the distribution of the level difference.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 6A and 6B illustrate an example of the distribution of transmission characteristics;

FIGS. 7A-7D are diagrams explaining a relationship between the distribution of transmission characteristics and a time-series change;

FIGS. 16A and 16B are diagrams explaining a correction method in a case in which suppression ranges overlap each other; and FIG. 17 illustrates a hardware configuration of a computer.

DESCRIPTION OF EMBODIMENTS

Preferred embodiments of the present invention will be explained with reference to accompanying drawings.

When suppressing a sound signal in accordance with a transmission characteristic, a gain to be multiplied to the sound signal is determined according to a value of a transmission characteristic estimated at a certain point in time. However, in a case in which a sound source that is a sound collection target is a person, a transmission characteristic of sound is not always a constant value, and a temporal change in the transmission characteristic is a distribution having a spread before and after a peak value. Therefore, when a gain to be multiplied to a sound signal is determined according to a value of a transmission characteristic estimated at a certain point in time, an erroneous suppression may be performed on the sound signal due to a difference between an actual transmission characteristic and the estimated transmission characteristic. Embodiments of sound processing that enables to appropriately suppress a sound signal in accordance with a transmission characteristic are described below.

First Embodiment

Figure 1:
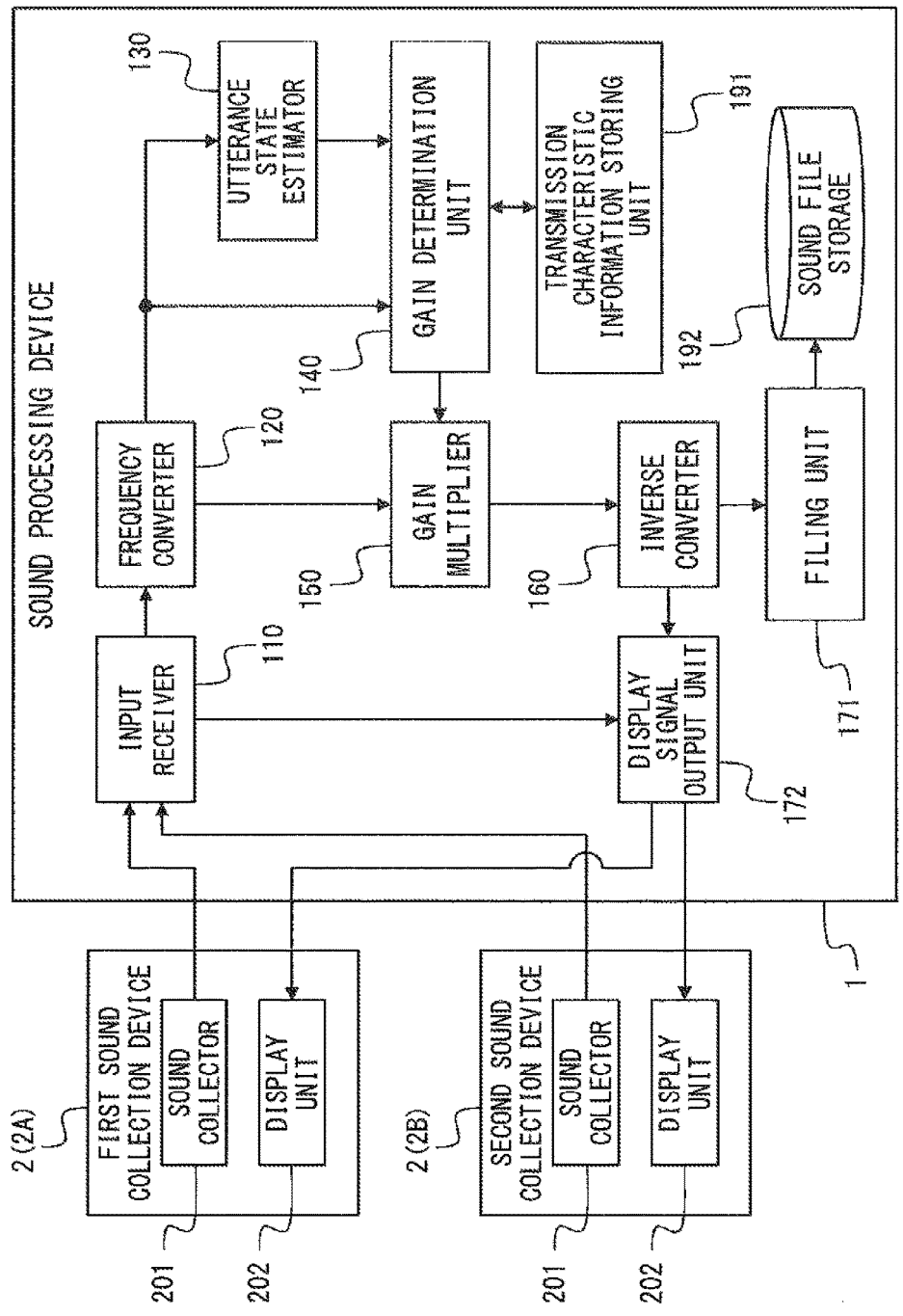
FIG. 1 illustrates a functional configuration of a sound processing device according to a first embodiment.

FIG. 1 illustrates a functional configuration of a sound processing device according to a first embodiment.

As illustrated in FIG. 1, a sound processing device 1 according to this embodiment includes an input receiver 110, a frequency converter 120, an utterance state estimator 130, a gain determination unit 140, a gain multiplier 150, and an inverse converter 160. The sound processing device 1 also includes a filing unit 171 and a display signal output unit 172. The sound processing device 1 further includes a transmission characteristic information storing unit 191 and a sound file storage 192.

The input receiver 110 receives an input of sound signals that are collected by a plurality of sound collection devices including a first sound collection device 2 (2A) and a second sound collection device 2 (2B). The input receiver 110 converts analog sound signals that are input, for example, from the first sound collection device 2A and the second sound collection device 2B into digital sound signals. Each of the first sound collection device 2A and the second sound collection device 2B includes a sound collector 201 and a display unit 202. The sound collector 201 is a microphone, and the sound collector 201 collects sound around the sound collector 201. The display unit 202 is, for example, a light emitting diode (LED) lamp, and the display unit 202 is turned on, turned off, or caused to blink according to a display signal that is input from an external device such as the sound processing device 1.

The frequency converter 120 converts respective sound signals input from the plurality of sound collection devices 2 into frequency spectra. The frequency converter 120 divides the input sound signal of a time domain into frames for each prescribed time length T, and the frequency converter 120 converts a sound signal of each of the frames into a frequency spectrum by performing, for example, the short-time discrete Fourier transform (STDFT). In the description below, a sound signal that is input from the first sound collection device 2A is referred to as a first sound signal, and a sound signal that is input from the second sound collection device 2B is referred to as a second sound signal. In addition, in the description below, a frequency spectrum of the first sound signal is referred to as a first frequency spectrum, and a frequency spectrum of the second sound signal is referred to as a second frequency spectrum.

The utterance state estimator 130 estimates an utterance state of a person in a frame to be processed in accordance with the first frequency spectrum and the second frequency spectrum. The utterance state estimator 130 estimates an utterance state of persons in a frame to be processed, for example, according to a known estimation method in an utterance dialization technology. As an example, in a case in which the first sound collection device 2A is provided near one of two persons and the second sound collection device 2B is provided near the other of the two persons, the utterance state estimator 130 estimates which of the following four states an utterance state of the persons is.

(State 1) A state in which there are no persons making an utterance.

(State 2) A state in which only the person near the first sound collection device 2A is making an utterance.

(State 3) A state in which only the person near the second sound collection device 2B is making an utterance.

(State 4) A state in which both the person near the first sound collection device 2A and the person near the second sound collection device 2B are making an utterance.

The gain determination unit 140 determines a gain to be multiplied to each of the frequency spectra. When an utterance state of a frame to be processed is a state in which only one person is making an utterance, the gain determination unit 140 estimates a transmission characteristic according to a frequency spectrum and the utterance state, and calculates a degree of variation in the transmission characteristic during a prescribed period. In calculating the degree of variation in the transmission characteristic during the prescribed period, the gain determination unit 140 refers to transmission characteristics stored in the transmission characteristic information storing unit 191 and information indicating a peak value of the distribution of transmission characteristics. In addition, the gain determination unit 140 specifies a threshold of a suppression range in accordance with the peak value of the distribution of transmission characteristics and the degree of variation in the transmission characteristic during the prescribed period. Further, the gain determination unit 140 calculates a gain to be multiplied to the frequency spectrum in accordance with the frequency spectrum, the threshold of the suppression range, and a background noise spectrum. The gain determination unit 140 estimates a background noise spectrum for the frequency spectrum according to a known estimation method such as the spectral suppression method.

The gain multiplier 150 multiplies the gain calculated by the gain determination unit 140 to the frequency spectrum.

The inverse converter 160 converts the frequency spectrum into a sound signal of a time domain. The inverse converter 160 converts the frequency spectrum to which the gain has been multiplied into a sound signal of the time domain by performing, for example, the inverse short-time discrete Fourier transform (inverse STDFT).

The filing unit 171 converts the sound signal of the time domain that has been obtained by converting the frequency spectrum by using the inverse converter 160 into a sound file according to a prescribed file format, and stores the sound file in the sound file storage 192.

The display signal output unit 172 generates and outputs a display signal that controls display of the display unit 202 of the sound collection device 2. The display signal output unit 172 generates a display signal that is output to the display unit 202 of the first sound collection device 2A and a display signal that is output to the display unit 202 of the second sound collection device 2B in accordance with the input sound signal and the sound signal of the time domain that has been obtained by converting the frequency spectrum by using the inverse converter 160.

Figure 2:
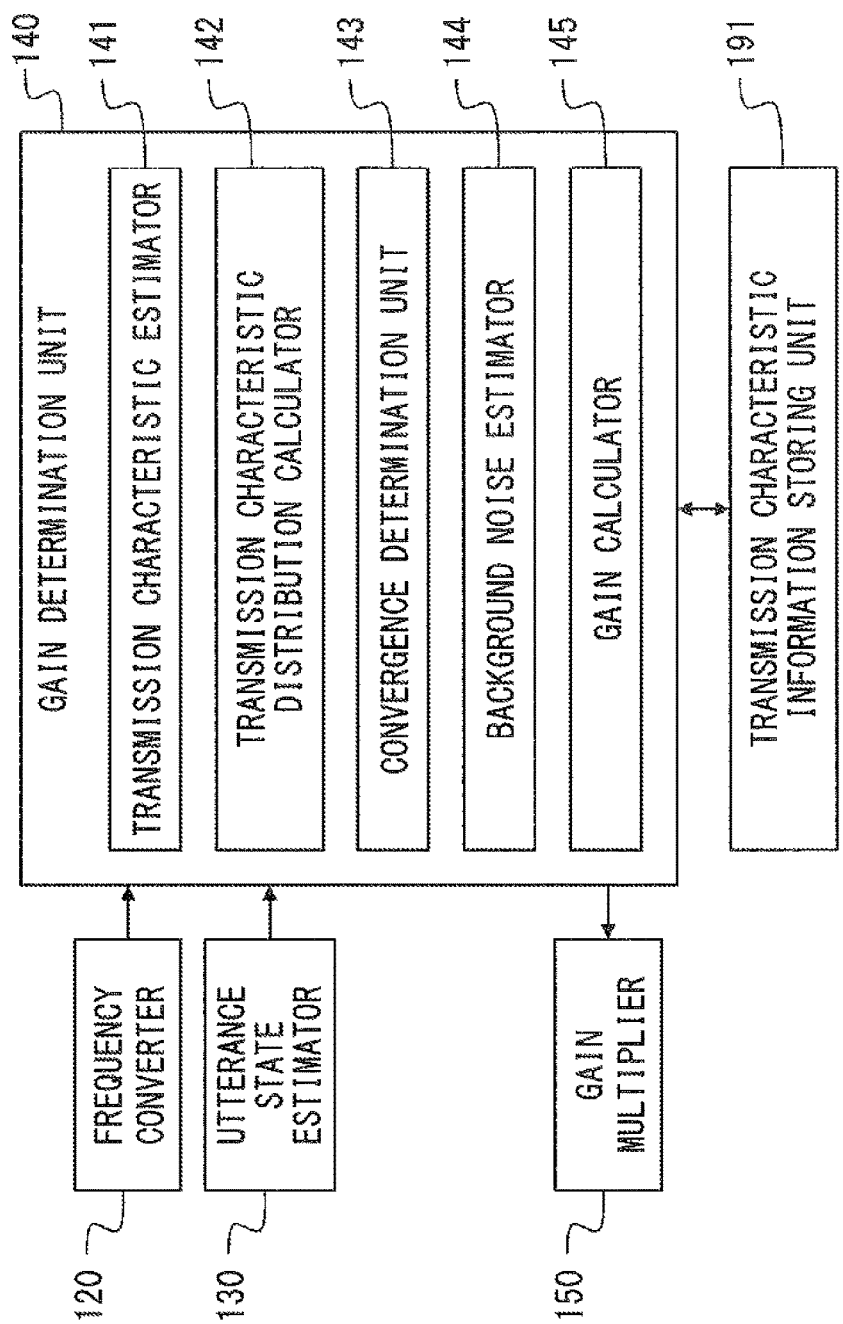
FIG. 2 illustrates the configuration of a gain determination unit in the sound processing device according to the first embodiment.

FIG. 2 illustrates the configuration of a gain determination unit in the sound processing device according to the first embodiment.

As illustrated in FIG. 2, the gain determination unit 140 according to this embodiment includes a transmission characteristic estimator 141, a transmission characteristic distribution calculator 142, a convergence determination unit 143, a background noise estimator 144, and a gain calculator 145.

The transmission characteristic estimator 141 estimates (calculates) a transmission characteristic according to a frequency spectrum and an utterance state when an utterance state of a frame to be processed is a state in which only one person is making an utterance. The transmission characteristic estimator 141 specifies a sound collection device 2 that is provided near the person making an utterance in accordance with information indicating the utterance state, and estimates a transmission characteristic at the time when the person near the specified sound collection unit 2 is making an utterance. The transmission characteristic estimator 141 estimates, for each band of the frequency spectrum, a transmission characteristic in accordance with a frequency spectrum of a sound signal that is input from the sound collection device 2 provided near the person making an utterance and a frequency spectrum of a sound signal that is input from another sound collection device. The transmission characteristic estimator 141 stores the estimated transmission characteristics in the transmission characteristic information storing unit 191.

As an example, when two sound signals, the first sound signal and the second sound signal, are input as input sound signals, the transmission characteristic estimator 141 estimates (calculates) a transmission characteristic at the time when only a person near the first sound collection device 2A is making an utterance or at the time when only a person near the second sound collection device 2B is making an utterance. In this case, the transmission characteristic estimator 141 calculates, as the transmission characteristic, a difference between a frequency spectrum of a sound signal that is input from the first sound collection device 2A and a frequency spectrum of a sound signal that is input from the second sound collection device 2B.

The transmission characteristic distribution calculator 142 calculates the distribution of transmission characteristics in accordance with a transmission characteristic of a frame to be processed and transmission characteristics during a prescribed period that have been stored in the transmission characteristic information storing unit 191, and calculates a degree of variation in the transmission characteristic. The transmission characteristic distribution calculator 142 uses, for example, an average of the transmission characteristics during the specified period as a peak value of the distribution of transmission characteristics, and calculates a degree of variation from the peak value. The transmission characteristic distribution calculator 142 stores the distribution of transmission characteristics and the degree of variation that have been calculated in the transmission characteristic information storing unit 191.

The convergence determination unit 143 determines whether the peak value of the distribution of transmission characteristics and the degree of variation in the transmission characteristic have been converged. As an example, the convergence determination unit 143 calculates an inclination of a regression line from a peak value of the distribution of transmission characteristics during a prescribed period (a prescribed number of frames), and determines that the peak value of the distribution of the transmission characteristics has been converged when the inclination of the regression line is smaller than a threshold.

The background noise estimator 144 estimates a background noise spectrum for a frequency spectrum of an input sound signal according to a known estimation method.

The gain calculator 145 calculates a threshold of a suppression range in accordance with the peak value of the distribution of the transmission characteristics and the degree of variation in the transmission characteristic, and calculates a gain to be multiplied to the frequency spectrum in accordance with the threshold of the suppression range and a level difference between frequency spectra.

The sound processing device 1 according to this embodiment can be used to record a conversation (a dialog) among a plurality of persons that has been collected by a plurality of sound collection devices.

Figure 3:
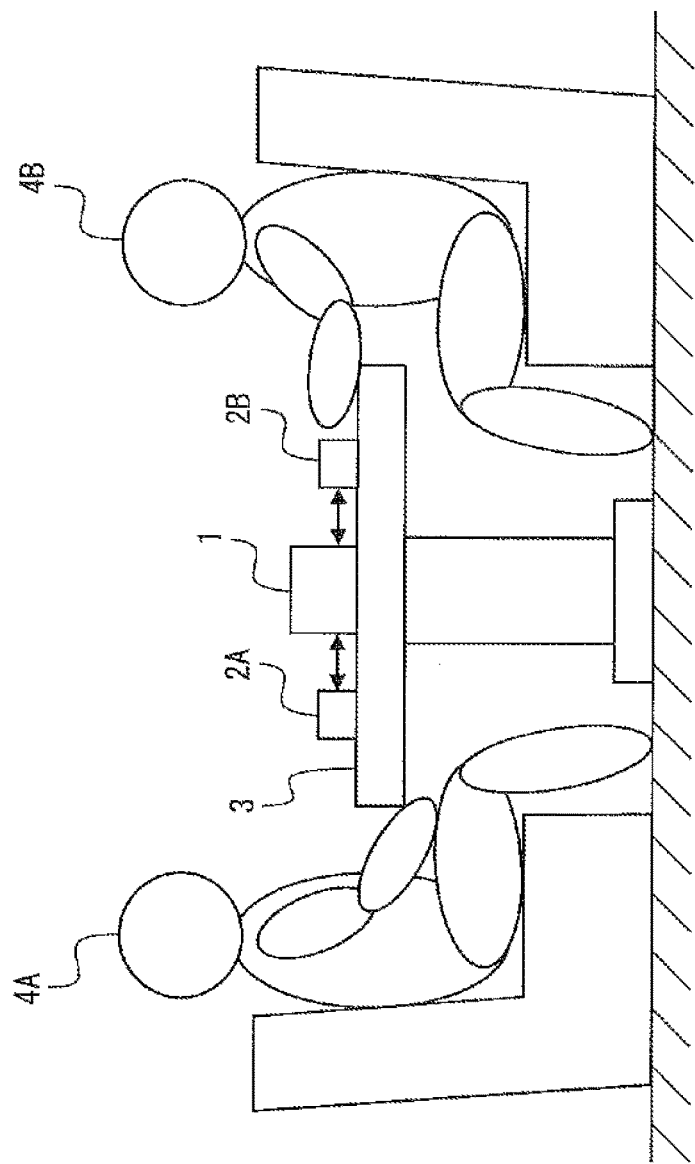
FIG. 3 illustrates an application example of the sound processing device according to the first embodiment.

FIG. 3 illustrates an application example of the sound processing device according to the first embodiment.

FIG. 3 illustrates, as an application example of the sound processing device 1 according to this embodiment, a position relationship among sound collection devices 2A and 2B and persons 4A and 4B in a case in which a conversation between the two persons 4A and 4B facing each other across a table 3 is recorded. The conversation between the two persons 4A and 4B is collected by using the first sound collection device 2A and the second sound collection device 2B that are connected to the sound processing device 1. In this case, the first sound collection device 2A is provided near the first person 4A in such a way that a distance from the second person 4B to the first sound collection device 2A is longer than a distance from the second person 4B to the second sound collection device 2B. In contrast, the second sound collection device 2B is provided near the second person 4B in such a way that a distance from the first person 4A to the second sound collection device 2B is longer than a distance from the second person 4B to the second sound collection device 2B. Stated another way, the first sound collection device 2A is provided near the first person 4A in order to collect sound emitted by the first person 4A, and the second sound collection device 2B is provided in order to collect sound emitted by the second person 4B.

However, in a case in which the two persons 4A and 4B are having a conversation, a sound signal collected by the first sound collection device 2A includes the sound of the second person 4B in addition to the sound of the first person 4A that is a sound collection target. A sound signal collected by the second sound collection device 2B includes the sound of the first person 4A in addition to the sound of the second person 4B that is a sound collection target. The sound processing device 1 according to this embodiment suppresses the sound of a person different from a person that is a sound collection target in a sound signal including the sound of the person that is a sound collection target and the sound of the person different from the person that is a sound collection target. Stated another way, the sound processing device 1 suppresses the sound of the second person 4B that is included in a sound signal collected by the first sound collection device 2A, and also suppresses the sound of the first person 4A that is included in a sound signal collected by the second sound collection device 2B.

When processing for recording a conversation is started, the sound processing device 1 according to this embodiment first starts processing for obtaining sound signals from respective sound collection devices 2. In a case in which two sound collection devices, the first sound collection device 2A and the second sound collection device 2B, are used to record a conversation, the sound processing device 1 obtains the first sound signal from the first sound collection device 2A, and also obtains the second sound signal from the second sound collection device 2B. After starting the processing for obtaining sound signals collected by respective sound collection devices, the sound processing device 1 according to this embodiment performs the processing illustrated in FIG. 4.

Figure 4:
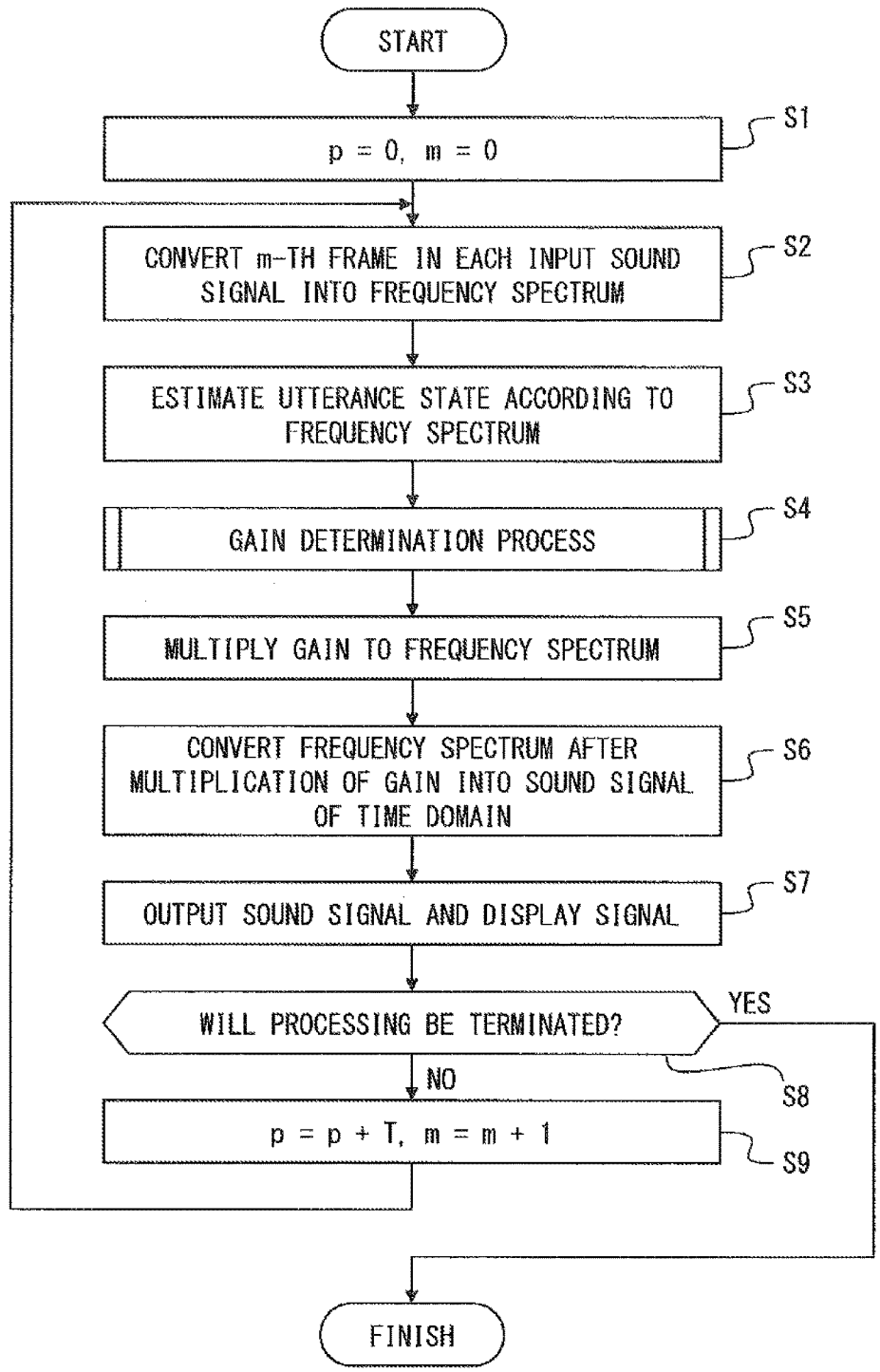
FIG. 4 is a flowchart explaining processing performed by the sound processing device according to the first embodiment.

FIG. 4 is a flowchart explaining processing performed by the sound processing device according to the first embodiment.

The sound processing device 1 according to this embodiment divides an input sound signal into sections (frames) each having a prescribed time length T, and performs a process for multiplying a gain to each of the frames. Accordingly, the sound processing device 1 first sets a variable p that specifies an analysis start point in the input sound signal to 0, and also sets a variable m that specifies a frame number to 0 (step S1). The process of step S1 is performed by the frequency converter 120. Here, the analysis start point p indicates a start time of a frame to be processed in the input sound signal.

Then, the sound processing device 1 extracts the m-th frame in each of the input sound signals, and converts a sound signal of the frame into a frequency spectrum (step S2). The process of step S2 is performed by the frequency converter 120. The frequency converter 120 extracts a section from time p to time p+T in an input sound signal $x_n(t)$ as a frame to be processed in accordance with the analysis start point p and the time length T of one frame. At this time, the frequency converter 120 assigns a frame number m indicating a time-series order to the extracted frame. In the case of N input sound signals, the frequency converter 120 extracts a frame $F_{n,m}(t)$ to be processed from each of the N input signals $x_n(t)$ (n=1, 2, ..., N).

In addition, the frequency converter 120 converts a sound signal of each of the extracted frames $F_{n,m}(t)$ into a frequency spectrum $X_n(m,k)$ (k=0, 1, ..., T−1). The frequency converter 120 converts each of the frames $F_{n,m}(t)$ extracted from the respective input sound signals $x_n(t)$ from a sound signal of a time domain to a frequency spectrum $X_n(m,k)$ by using a known conversion method. As an example, the frequency converter 120 converts each of the frames $F_{n,m}(t)$ into a frequency spectrum $X_n(m,k)$ by performing the short-time discrete Fourier transform.

Then, the sound processing device 1 estimates an utterance state of the frame to be processed on the basis of the frequency spectrum $X_n(m,k)$ (step S3). The process of step S3 is performed by the utterance state estimator 130. The utterance state estimator 130 estimates the number of persons making an utterance in the frame to be processed and their positions in accordance with a known estimation method such as an utterance dialization technology.

In addition, after estimating the utterance state of the frame to be processed, the utterance state estimator 130 generates a variable C(m) indicating an estimation result. When the utterance state of the frame to be processed is a state in which only one person is making an utterance, the utterance state estimator 130 sets an estimation result C(m) of the utterance state to a value n (≠0) that indicates a sound signal that is input from a sound collection device 2 provided near a person making an utterance. When the utterance state of the frame to be processed is not a state in which only one person is making an utterance, the utterance state estimator 130 sets the estimation result C(m) of the utterance state to "0". The utterance state estimator 130 reports the estimation result C(m) of the utterance state to the gain determination unit 140.

Then, the sound processing device 1 performs a gain determination process (step S4) for determining a gain to be multiplied to a frequency spectrum of each of the input sound signals in accordance with the estimation result C(m) of the utterance state, and the like. The process of step S4 is performed by the gain determination unit 140.

When one person is making an utterance (C(m)=n), the gain determination unit 140 estimates a transmission characteristic $d_n(m,k)$ according to the estimation result C(m) of the utterance state, and calculates, for example, a peak value $D_n(m,k)$ of the distribution of transmission characteristics and a degree $\sigma_n(m,k)$ of variation. At this time, the gain determination unit 140 refers to information relating to transmission characteristics of past frames that have been stored in the transmission characteristic information storing unit 191, and calculates the peak value $D_n(m,k)$ of the distribution of transmission characteristics and the degree $\sigma_n(m,k)$ of variation.

In addition, the gain determination unit 140 according to this embodiment determines whether a temporal change in the peak value $D_n(m,k)$ of the distribution of transmission characteristics and a temporal change in the degree $\sigma_n(m,k)$ of variation have been converged. Only when the peak value $D_n(m,k)$ and the degree $\sigma_n(m,k)$ of variation have been converged, the gain determination unit 140 calculates a gain $G_n(m,k)$ according to the peak value $D_n(m,k)$ and the degree $\sigma_n(m,k)$ of variation.

At this time, the gain determination unit 140 calculates a threshold $TH_n(m,k)$ of a suppression range according to the peak value $D_n(m,k)$ and the degree $\sigma_n(m,k)$ of variation, and calculates a gain $G_n(m,k)$ for a band k in which an absolute value of the transmission characteristic is within the suppression range. The gain determination unit 140 according to this embodiment estimates a background sound spectrum $BN_n(m,k)$ for the frequency spectrum $X_n(m,k)$ of the input sound signal. The gain determination unit 140 calculates the gain $G_n(m,k)$ according to the frequency spectrum $X_n(m,k)$ and the background sound spectrum $BN_n(m,k)$. On the other hand, the gain determination unit 140 sets a value of the gain $G_n(m,k)$ for a frequency spectrum $X_n(m,k)$ of a band k in which one (or both) of the peak value $D_n(m,k)$ and the degree $\sigma_n(m,k)$ of variation has not been converged to a value that does not change the frequency spectrum $X_n(m,k)$.

When the gain determination process above is finished, the sound processing device 1 multiplies the calculated gain to the frequency spectrum (step S5). The process of step S5 is performed by the gain multiplier 150. The gain multiplier 150 uses, for example, the value $S_n(m,k)=G_n(m,k)\cdot X_n(m,k)$ that is obtained by multiplying the frequency spectrum $X_n(m,k)$ by the gain $G_n(m,k)$ as a frequency spectrum after multiplication of a gain.

After the processes of steps S4 and S5 are finished, the sound processing device 1 converts the frequency spectrum after multiplication of a gain into a sound signal of the time domain (step S6). The process of step S6 is performed by the inverse converter 160. The inverse converter 160 converts the frequency spectrum into the sound signal of the time domain by performing a transform inverse to a transform at the time when the frequency converter 120 converts a sound signal of the time domain into a frequency spectrum. As an example, in a case in which the frequency converter 120 converts a sound signal of the time domain into a frequency spectrum by performing the short-time discrete Fourier transform, the inverse converter 160 converts a frequency spectrum into a sound signal of the time domain by performing the inverse short-time discrete Fourier transform.

Then, the sound processing device 1 outputs a sound signal and a display signal (step S7). The process of step S7 is performed by the filing unit 171 and the display signal output unit 172. The filing unit 171 generates a sound file of a prescribed file format in accordance with the sound signal obtained by the inverse converter 160, and stores the sound file in the sound file storage 192. The display signal output unit 172 specifies a sound collection device 2 that is provided near a person making an utterance in accordance with the sound signal that is input from the sound collection device 2 and the sound signal obtained by the inverse converter 160, and generates a display signal that turns on a display unit 202 of the specified sound collection device 2. In addition, the display signal output unit 172 generates a display signal that turns off display units 202 of sound collection devices 2 other than the sound collection device 2 provided near the person making the utterance. The display signal output unit 172 outputs the generated display signals to the display units 202 of the respective sound collection devices 2. When there are no persons making an utterance, or when two or more persons are making an utterance, the display signal output unit 172 generates a display signal that turns off display units 202 of all of the sound collection devices 2, and outputs the display signal to the display units 202 of the respective sound collection devices 2.

When the process of step S7 is finished, the sound processing device 1 determines whether the processes of steps S2 to S7 will be terminated (step S8). The determination of step S8 is performed, for example, by the frequency converter 120. When recording is finished and the processes of steps S2 to S8 have been performed on all frames in the input sound signal, or when an instruction to terminate processing is input from an external device or the like in the middle of the processing, the frequency converter 120 terminates the processing above (step S8; YES). When a termination condition is not satisfied (step S8; NO), the frequency converter 120 updates the analysis start point p to p+T and updates the frame number m to m+1 (step S9), and performs the process of step S2.

The gain determination process (step S4) according to this embodiment is described next in detail with reference to FIG. 5.

Figure 5:
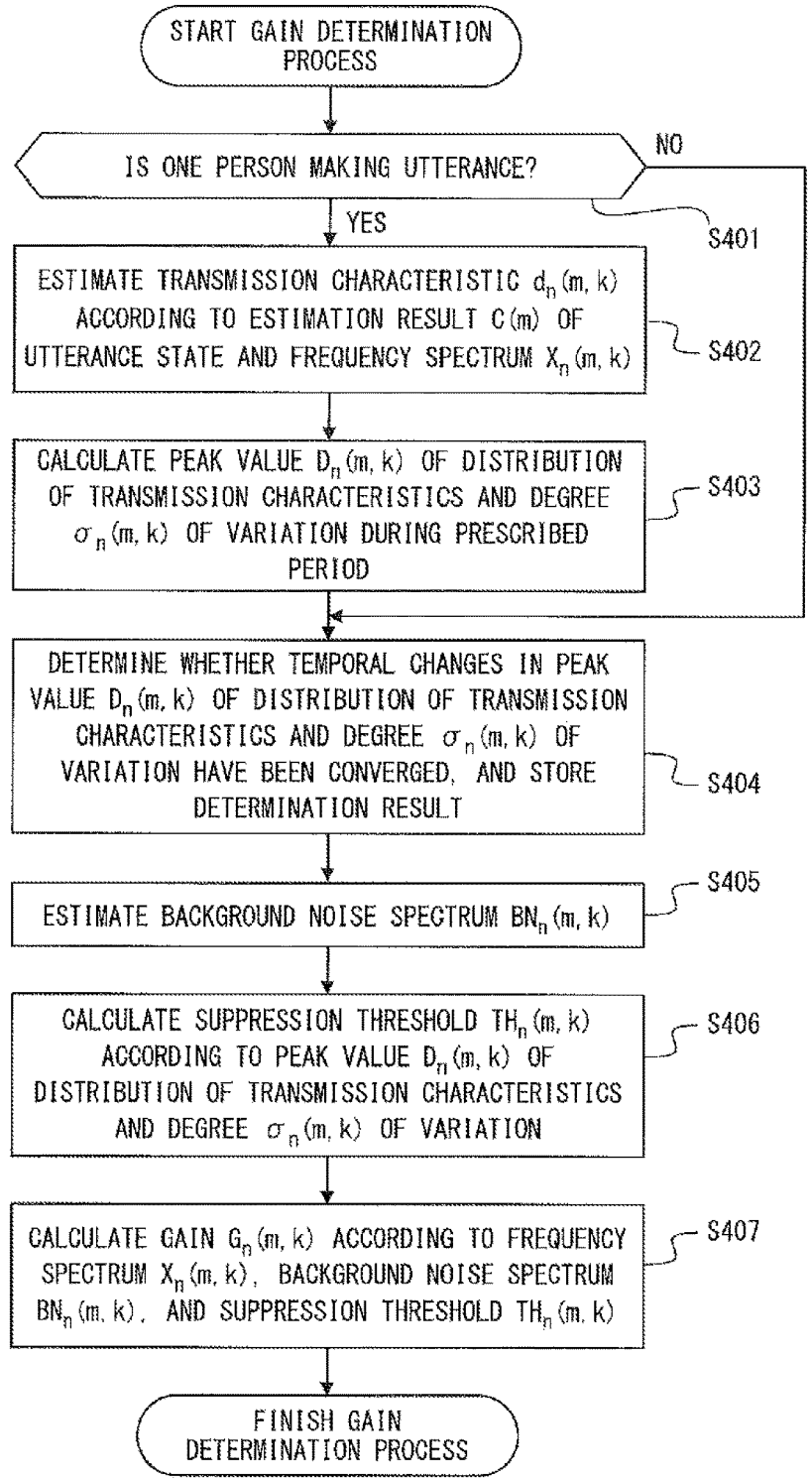
FIG. 5 is a flowchart explaining the content of a gain determination process according to the first embodiment.

FIG. 5 is a flowchart explaining the content of the gain determination process according to the first embodiment.

In the gain determination process according to this embodiment, the gain determination unit 140 first determines whether one person is making an utterance in accordance with the estimation result C(m) of the utterance state that has been received from the utterance state estimator 130 (step S401), as illustrated in FIG. 5. The process of step S401 is performed by the transmission characteristic estimator 141.

When one person is making an utterance (step S401; YES), the transmission characteristic estimator 141 performs a process for estimating a transmission characteristic $d_n(m,k)$ in accordance with the estimation result C(m) of the utterance state and the frequency spectrum $X_n(m,k)$ (step S402). In step S402, the transmission characteristic estimator 141 specifies a sound collection device that is provided near the person making an utterance in accordance with the estimation result C(m) of the utterance state. The transmission characteristic estimator 141 estimates a transmission characteristic $d_n(m,k)$ at the time when a person near the specified sound collection device is making an utterance. The transmission characteristic estimator 141 calculates a level difference between a frequency spectrum $X_n(m,k)$ at the time when n=C(m) and another frequency spectrum $X_n(m,k)$ that is associated with the frequency spectrum $X_n(m,k)$ as the transmission characteristic $d_n(m,k)$. As an example, when there are two input sound signals ($x_1(t)$ and $x_2(t)$) and estimation result C(m) of utterance state is 1 (C(m)=1), the transmission characteristic estimator 141 calculates transmission characteristics $d_1(m,k)$ and $d_2(m,k)$ of respective bands k according to expression (2-1) and expression (2-2) described below.

$$d_1(m,k) = X_1(m,k) - X_2(m,k) \quad (2\text{-}1)$$

$$d_2(m,k) = \text{none} \quad (2\text{-}2)$$

In addition, when there are two input sound signals ($x_1(t)$ and $x_2(t)$) and estimation result C(m) of utterance state is 2 (C(m)=2), the transmission characteristic estimator 141 calculates transmission characteristics $d_1(m,k)$ and $d_2(m,k)$ of respective bands k according to expression (2-3) and expression (2-4) described below.

$$d_1(m,k) = \text{none} \quad (2\text{-}3)$$

$$d_2(m,k) = X_1(m,k) - X_2(m,k) \quad (2\text{-}4)$$

In expression (2-2) and expression (2-3), "none" means that the transmission characteristic $d_2(m,k)$ and the transmission characteristic $d_1(m,k)$ are excluded from subsequent targets to be processed, respectively.

The transmission characteristic estimator 141 stores the estimated transmission characteristic $d_n(m,k)$ (n=0, 1, ..., N; k=0, 1, ..., T−1) in the transmission characteristic information storing unit 191.

The gain determination unit 140 then calculates a peak value $D_n(m,k)$ of the distribution of transmission characteristics and a degree $\sigma_n(m,k)$ of variation in the transmission characteristic during a prescribed period including the transmission characteristic $d_n(m,k)$ (step S403). The process of step S403 is performed by the transmission characteristic distribution calculator 142.

The transmission characteristic distribution calculator 142 calculates the peak value $D_n(m,k)$ of the distribution of transmission characteristics and the degree $\sigma_n(m,k)$ of variation, for example, in accordance with transmission characteristics $d_n(m-h0, k)$ to $d_n(m,k)$ for more than ten seconds to several tens of seconds. The transmission characteristic distribution calculator 142 calculates the peak value $D_n(m,k)$ of the distribution according to expression (3-1) described below, and also calculates the degree $\sigma_n(m,k)$ of variation according to expression (3-2), for example, for each variable n and each variable k.

$$D_n(m, k) = (1 - \alpha) \cdot D_n(m - 1, k) + \alpha \cdot d_n(m, k) \quad (3\text{-}1)$$

$$\sigma_n(m, k) = \frac{1}{m0} \sum_{i=m-m0}^{m} \{d_n(i, k) - D_n(i, k)\} \quad (3\text{-}2)$$

In expression (3-1), α indicates a weight coefficient. In expression (3-2), m0 indicates the number of frames that are referred to in calculating the degree $\sigma_n(m,k)$ of variation.

The gain determination unit 140 performs a process for determining whether a temporal change in the peak value $D_n(m,k)$ of the distribution of transmission characteristics and a temporal change in the transmission characteristic $d_n(m,k)$ have been converged (step S404). When there is not one person making an utterance (step S401; NO), the gain determination unit 140 skips the processes of steps S402 and S403, and performs the process of step S404. The process of step S404 is performed by the convergence determination unit 143.

The convergence determination unit 143 calculates an inclination of a regression line at a peak value $D_n(m,k)$ of a distribution from the frame number m−h1 to the frame number m by using a least-squares method. The convergence determination unit 143 determines that the peak value $D_n(m,k)$ has not been converged for a band k in which the inclination of the regression line is greater than or equal to a prescribed threshold THA, and the convergence determination unit 143 sets a convergence determination result $Dconv_n(k)$ to 0. In contrast, the convergence determination unit 143 determines that the peak value $D_n(m,k)$ has been converged for a band k in which the inclination of the regression line is smaller than the prescribed threshold THA, and the convergence determination unit 143 sets the convergence determination result $Dconv_n(k)$ to 1.

Similarly, the convergence determination unit 143 calculates, for each band k, the inclination of the regression line at transmission characteristics $d_n(m,k)$ from the frame number m−h1 to the frame number m by using the least-squares method. The convergence determination unit 143 determines that the transmission characteristic $d_n(m,k)$ has not been converged for a band k in which the inclination of the regression line is greater than or equal to a prescribed threshold THB, and the convergence determination unit 143 sets a convergence determination result $dconv_n(k)$ to 0. In contrast, the convergence determination unit 143 determines that the transmission characteristic $d_n(m,k)$ has been converged for a band k in which the inclination of the regression line is smaller than the prescribed threshold THB, and the convergence determination unit 143 sets the convergence determination result $dconv_n(k)$ to 1.

The convergence determination unit 143 transfers the convergence determination results $Dconv_n(k)$ and $dconv_n(k)$ to the gain calculator 145.

Then, the gain determination unit 140 estimates a background noise spectrum $BN_n(m,k)$ according to the frequency spectrum $X_n(m,k)$ (step S405). The process of step S405 is performed by the background noise estimator 144. The background noise estimator 144 estimates the background noise spectrum $BN_n(m,k)$ according to the frequency spectrum $X_n(m,k)$ by using a known estimation method. The background noise estimator 144 transfers the estimated background noise spectrum $BN_n(m,k)$ to the gain calculator 145.

The gain determination unit 140 calculates a suppression threshold $TH_n(m,k)$ according to the peak value $D_n(m,k)$ of the distribution of transmission characteristics and the degree $\sigma_n(m,k)$ of variation (step S406). The process of step S406 is performed by the gain calculator 145. The gain calculator 145 calculates the suppression threshold $TH_n(m,k)$ according to expression (4) described below.

$$TH_n(m,k)=D_n(m,k)+\beta \cdot \sigma_n(m,k) \tag{4}$$

In expression (4), $\beta$ is a weight coefficient.

The gain calculator 145 calculates a gain $G_n(m,k)$ according to the convergence determination results $Dconv_n(k)$ and $dconv_n(k)$, the frequency spectrum $X_n(m,k)$, the background noise spectrum $BN_n(m,k)$, and the suppression threshold $TH_n(m,k)$ (step S407).

The gain calculator 145 sets all gains $G_n(m,k)$ to be multiplied to frequency spectra $X_n(m,k)$ of a band k for which a convergence determination result is $Dconv_n(k)=0$ or $dconv_n(k)=0$ from among all of the frequency spectra $X_n(m,k)$ to 1.

In contrast, the gain calculator 145 calculates gains $G_n(m,k)$ to be multiplied to spectra $X_n(m,k)$ of a band k for which the convergence determination result is $Dconv_n(k)=dconv_n(k)=1$ from among all of the frequency spectra $X_n(m,k)$, as described below.

First, the gain calculator 145 compares an absolute value of a level difference between a spectrum $X_n(m,k)$ of a band k and another spectrum $X_{n'}(m,k)$ associated with the spectrum $X_n(m,k)$ with the suppression threshold $TH_n(m,k)$. Here, assume that a correspondence relationship between the spectrum $X_n(m,k)$ of the band k and the other spectrum $X_{n'}(m,k)$ is the same correspondence relationship as a correspondence relationship at the time of calculation of a transmission characteristic. When the absolute value of the level difference between spectra is smaller than the suppression threshold $TH_n(m,k)$, the gain calculator 145 calculates respective gains $G_n(m,k)$ and $G_{n'}(m,k)$ to be multiplied to the spectrum $X_n(m,k)$ of the band k and the spectrum $X_{n'}(m,k)$ according to expression (5-1) and expression (5-2).

$$G_n(m,k)=1 \tag{5-1}$$

$$G_{n'}(m,k)=BN_{n'}(m,k)/X_{n'}(m,k) \tag{5-2}$$

When the absolute value of the level difference between spectra is smaller than the suppression threshold $TH_{n'}(m,k)$, the gain calculator 145 calculates the respective gains $G_n(m,k)$ and $G_{n'}(m,k)$ to be multiplied to the spectrum $X_n(m,k)$ of the band k and the spectrum $X_{n'}(m,k)$ according to expression (5-3) and expression (5-4).

$$G_n(m,k)=BN_n(m,k)/X_n(m,k) \tag{5-3}$$

$$G_{n'}(m,k)=1 \tag{5-4}$$

Namely, when an absolute value of a level difference between the first spectrum $X_n(m,k)$ and the second spectrum $X_{n'}(m,k)$, which corresponds to a transmission characteristic $d_n(m,k)$ for the band k, is smaller than the suppression threshold $TH_n(m,k)$, the gain calculator 145 suppresses the first spectrum $X_n(m,k)$. When an absolute value of a level difference between the first spectrum $X_n(m,k)$ and the second spectrum $X_{n'}(m,k)$, which corresponds to a transmission characteristic $d_{n'}(m,k)$ for the band k, is smaller than the suppression threshold $TH_{n'}(m,k)$, the gain calculator 145 suppresses the second spectrum $X_{n'}(m,k)$.

When the gain calculator 145 calculates gains $G_n(m,k)$ for all of the variables n, k that are targets to be processed, and transfers the calculated gains $G_n(m,k)$ to the gain multiplier 150, the gain determination process is terminated.

After the gain determination process is terminated, the sound processing device 1 calculates a frequency spectrum $S_n(m,k)$ to which the gain $G_n(m,k)$ has been multiplied, and converts the frequency spectrum $S_n(m,k)$ into a sound signal $sx_n(m,k)$ of the time domain, by using a known suppression method.

As described above, in the gain determination process according to this embodiment, a suppression threshold $TH_n(m,k)$ is calculated for each band k in accordance with a peak value $D_n(m,k)$ of the distribution of transmission characteristics and a degree $\sigma_n(m,k)$ of variation in the transmission characteristic during a prescribed period. At this time, the gain determination unit 140 calculates the suppression threshold $TH_n(m,k)$ in such a way that a suppression range of a band in which the degree $\sigma_n(m,k)$ of variation is large is wider than a suppression range of a band in which the degree $\sigma_n(m,k)$ of variation is small. Therefore, an insufficient suppression can be prevented in sound processing for suppressing a frequency spectrum $X_n(m,k)$ of an input signal when the transmission characteristic is within the suppression range. Thus, according to this embodiment, the sound of each person in a sound signal that collects a conversation among a plurality of persons can be separated accurately.

FIGS. 6A and 6B illustrate an example of the distribution of transmission characteristics.

When a sound signal is converted into a frequency spectrum and a transmission characteristic is calculated, a peak value of the distribution of transmission characteristics and a degree of variation in the transmission characteristic are different for each band. The distribution of transmission characteristics for a band k (=k1) of a frequency spectrum $X_1(m,k)$ during a prescribed period of a certain sound signal has a small degree of variation in the transmission characteristic and a sharp peak, as illustrated in FIG. 6A, for example. At this time, the distribution of transmission characteristics for another band k (=k2) of the frequency spectrum $X_1(m,k)$ may have a larger degree of variation and a sharper peak than the distribution of transmission characteristics for band k1, as illustrated in FIG. 6B, for example. Accordingly, as an example, when a suppression range is specified according to a peak value of the distribution of transmission characteristics and a fixed suppression threshold TH, a frequency spectrum $X_n(m,k2)$ for band k2 may be insufficiently suppressed.

FIGS. 7A-7D are diagrams explaining a relationship between the distribution of transmission characteristics and a time-series change.

FIG. 7A illustrates an example of the degree σ(k1) of variation in the distribution of transmission characteristics for band k1. FIG. 7B illustrates an example of a time-series change in the transmission characteristic d(k1) in a case in which a suppression range is specified according to the degree σ(k1) of variation in the distribution of transmission characteristics for band k1. In this case, the transmission characteristic d(k1) for the band k1 at each time changes, for example, between the upper limit value D(k1)+σ(k1) and the lower limit value D(k1)−σ(k1), with the peak value D(k1) of the distribution of transmission characteristics as a center. As described above, when the transmission characteristic d(k1) is within a suppression range that is specified according to the degree σ(k1) of variation, a corresponding frequency spectrum is suppressed by an appropriate gain, as described above.

FIG. 7C illustrates an example of the degree σ(k2) of variation in the distribution of transmission characteristics for band k2. FIG. 7D illustrates an example of a time-series change in the transmission characteristic d(k2) in a case in which a suppression range is specified according to the degree σ(k2) of variation in the distribution of transmission characteristics for band k2. FIG. 7D also illustrates a suppression range that is specified according to the degree σ(k1) of variation in the distribution of transmission characteristics for band k1.

The degree σ(k2) of variation in the distribution of transmission characteristics for band k2 is larger than the degree σ(k1) of variation in the distribution of transmission characteristics for band k1. Accordingly, a time-series change in the transmission characteristic d(k2) for band k2 has a larger amplitude than a time-series change in the transmission characteristic d(k1) for band k1. Here, when a suppression range for band k2 is specified according to the degree σ(k1) of variation for band k1, the suppression range is from the upper limit value D(k2)+σ(k1) to the lower limit value D(k2)−σ(k1) with the peak value D(k2) of the distribution of transmission characteristics as a center. In this case, as illustrated in FIG. 7D, the transmission characteristic d(k2) may exceed the suppression range. When the transmission characteristic d(k2) exceeds the suppression range, a spectrum of band k2 is excluded from a target for suppression, and therefore a sound signal after suppression has not been sufficiently suppressed.

In contrast, according to this embodiment, a range from the upper limit value D(k2)+σ(k2) to the lower limit value D(k2)−σ(k2) with the peak value D(k2) of the distribution of transmission characteristics as a center is specified as a suppression range in accordance with the degree σ(k2) of variation in the distribution of transmission characteristics for band k2. This can prevent the transmission characteristic d(k2) for band k2 from exceeding the suppression range.

Figure 8:
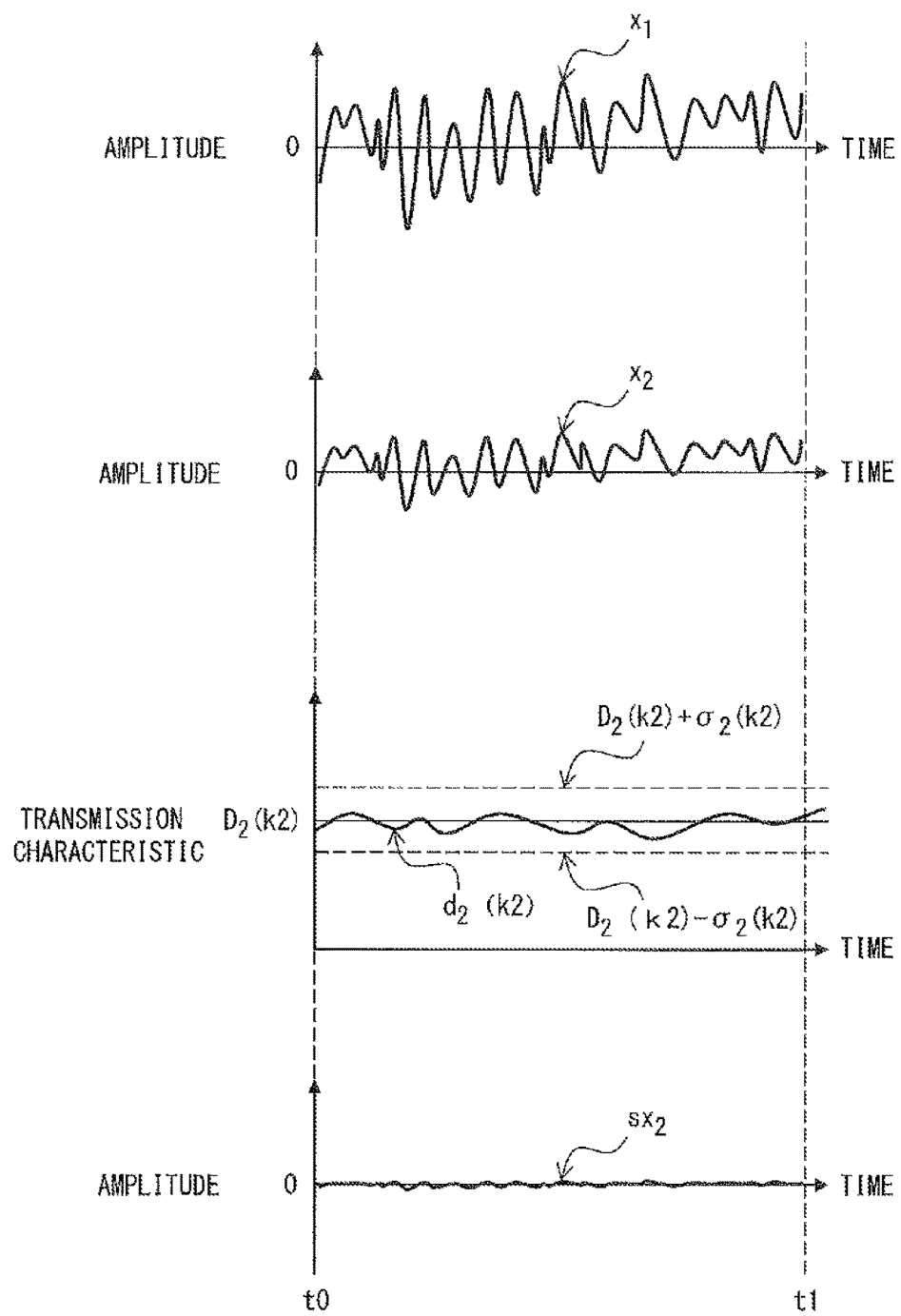
FIG. 8 illustrates an example of a processing result in a case in which a transmission characteristic is within a suppression range.

FIG. 8 illustrates an example of a processing result in a case in which a transmission characteristic is within a suppression range.

FIG. 8 illustrates a first sound signal $x_1$ that is input from the first sound collection device 2A and a second sound signal $x_2$ that is input from the second sound collection signal 2B. Here, assume that the first sound collection device 2A is provided near the first person 4A, and that the second sound collection device 2B is provided near the second person 4B, as illustrated in FIG. 3.

In FIG. 8, the amplitude of the first sound signal $x_1$ is larger than the amplitude of the second sound signal $x_2$ at the same time. Therefore, it is conceivable that the first person 4A near the first sound collection device 2A is making an utterance during a period from time t0 to time t1 illustrated in FIG. 8. In this case, the second sound signal $x_2$ includes the sound of the first person 4A that is not a sound collection target. Accordingly, the sound processing device 1 performs a process for suppressing a sound component of the first person 4A that is included in the second sound signal $x_2$. In this case, the sound processing device 1 specifies a suppression range (a suppression threshold) according to the peak value $D_2(k2)$ of the distribution of transmission characteristics in the frequency spectrum $X_2(m,k2)$ of the second sound signal $x_2$ and the degree $\sigma_2(k2)$ of variation, as illustrated in FIG. 8. Here, when the transmission characteristic $d_2$ of the second sound signal $x_2$ changes within the suppression range in all bands k including band k2 illustrated in FIG. 8, the amplitude of the sound signal $sx_2$ that is obtained from a frequency spectrum to which a gain has been multiplied is about 0, as illustrated in FIG. 8. As described above, when the frequency spectrum $X_2(m,k2)$ of the second sound signal $x_2$ changes within the suppression range, the sound component of the first person 4A that is included in the second sound signal $x_2$ can be appropriately suppressed, and sound sources (persons making an utterance) can be separated from each other.

Figure 9:
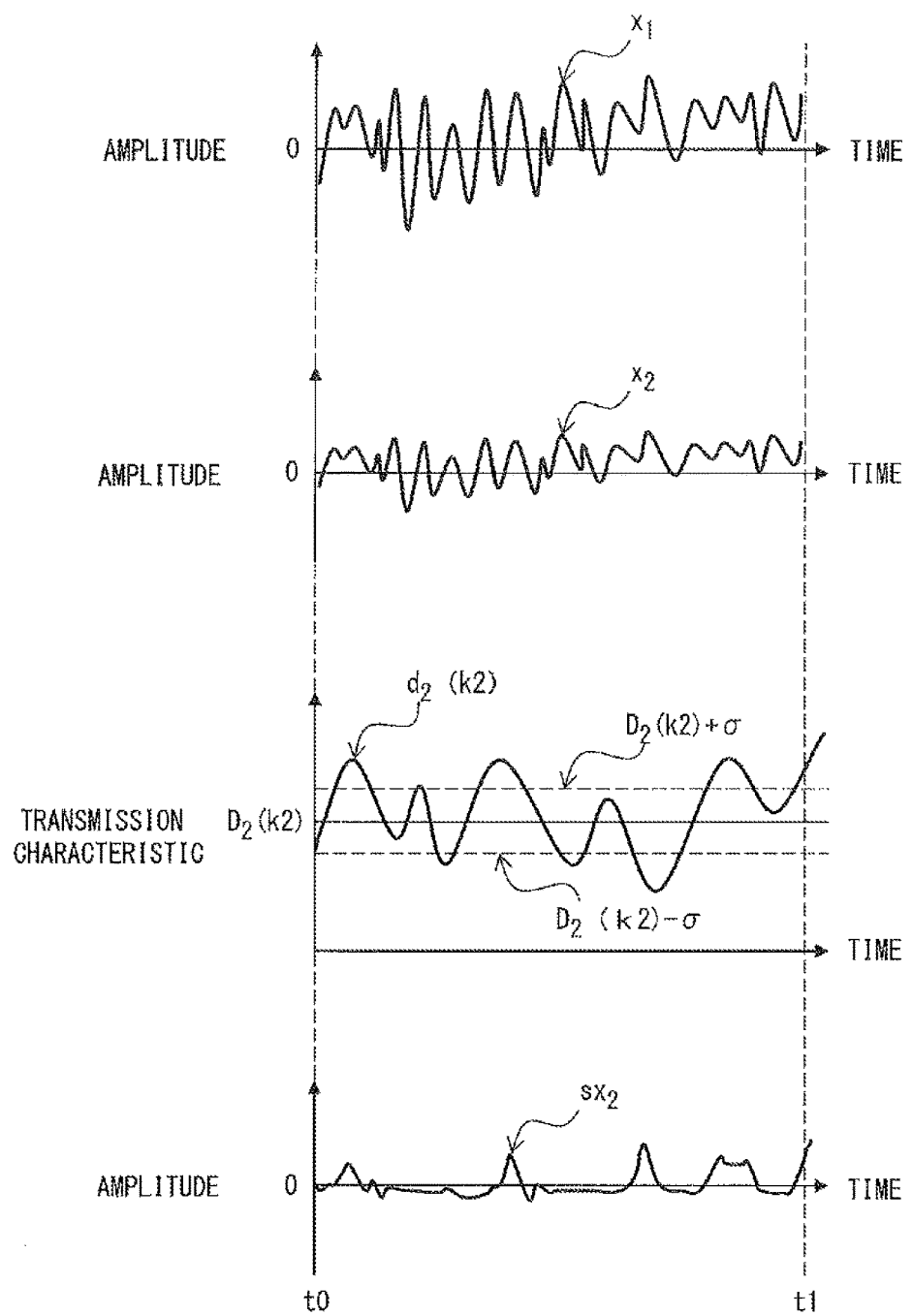
FIG. 9 illustrates an example of a processing result in a case in which there is a period in which a transmission characteristic is out of a suppression range.

FIG. 9 illustrates an example of a processing result in a case in which there is a period during which a transmission characteristic is out of a suppression range.

FIG. 9 illustrates a first sound signal $x_1$ that is input from the first sound collection device 2A and a second sound signal $x_2$ that is input from the second sound collection signal 2B. Here, assume that the first sound collection device 2A is provided near the first person 4A, and that the second sound collection device 2B is provided near the second person 4B, as illustrated in FIG. 3.

The first sound signal $x_1$ and the second sound signal $x_2$ that are illustrated in FIG. 9 respectively have the same patterns as those of the sound signals $x_1$ and $x_2$ illustrated in FIG. 8, and the first sound signal $x_1$ has a larger amplitude than the second sound signal $x_2$ at the same time. Therefore, it is conceivable that the first person 4A near the first sound collection device 2A is making an utterance during a period from time t0 to time t1 illustrated in FIG. 9. Accordingly, the sound processing device 1 performs a process for suppressing a sound component of the first person 4A that is included in the second sound signal $x_2$. In this case, the sound processing device 1 specifies a suppression range (a suppression threshold) according to the peak value $D_2(k2)$ of the distribution of transmission characteristics and a degree σ of variation in the frequency spectrum $X_2(m,k2)$ of the second sound signal $x_2$, as illustrated in FIG. 9. Here, the amplitude of the sound signal $sx_2$ that is obtained from a frequency spectrum to which a gain has been multiplied is almost 0 in a section in which the transmission characteristic $d_2$ of the second sound signal $x_2$ is within the suppression range in all bands k including band k2, as described above. In contrast, in a section in which the transmission characteristic $d_2$ in one or more bands including band k2 exceeds the suppression range, the gain that is multiplied to spectra of the one or more bands becomes "1", and the spectra are not suppressed. Accordingly, in a case in which there is a section (a band) in which the transmission characteristic $d_2$ exceeds the suppression range, a section in which suppression is insufficiently performed is generated, as illustrated as the sound signal $sx_2$ in FIG. 9, and it may be difficult to appropriately separate a sound source (a person making an utterance).

On the other hand, in the gain determination process according to this embodiment, a suppression range (a suppression threshold $TH_n(m,k)$) is controlled for each band k in accordance with a degree $\sigma_n(m,k)$ of variation in a transmission characteristic during a prescribed period, as described above. At this time, a suppression range of a band having a larger degree $\sigma_n(m,k)$ of variation in a transmission characteristic is wider than a suppression range of a band having a smaller degree $\sigma_n(m,k)$ of variation in the transmission characteristic. Thus, according to this embodiment, a situation can be prevented in which suppression is not sufficiently performed because a transmission characteristic in a band having a large degree $\sigma_n(m,k)$ of variation in the transmission characteristic goes beyond a suppression range.

The flowcharts of FIG. 4 and FIG. 5 are examples of the processing performed by the sound processing device 1. The content of the processing performed by the sound processing device 1 according to this embodiment is not limited to the content illustrated in FIG. 4 and FIG. 5, and can be appropriately changed without departing from the gist of this embodiment.

In addition, the degree $\sigma_n(m,k)$ of variation in the transmission characteristic is not limited to a value that is calculated according to expression (3) above, and the degree may be any degree of dispersion such as a mean deviation, a standard deviation, an absolute deviation, a variance, or a difference between a maximum value and a minimum value. Stated another way, a process performed by the transmission characteristic distribution calculator 142 according to this embodiment may be any process for calculating a value indicating the spread of the distribution of transmission characteristics (level differences between frequency spectra). In this case, the process for calculating a value indicating the spread of the distribution of the level differences between frequency spectra may be a process for performing calculation according to any one of a temporal change in a peak value of the distribution of level differences and the level difference above. The value indicating the spread of the distribution of level differences may be, for example, a difference between a maximum value and a minimum value of level differences for several seconds in the past.

Figure 10:
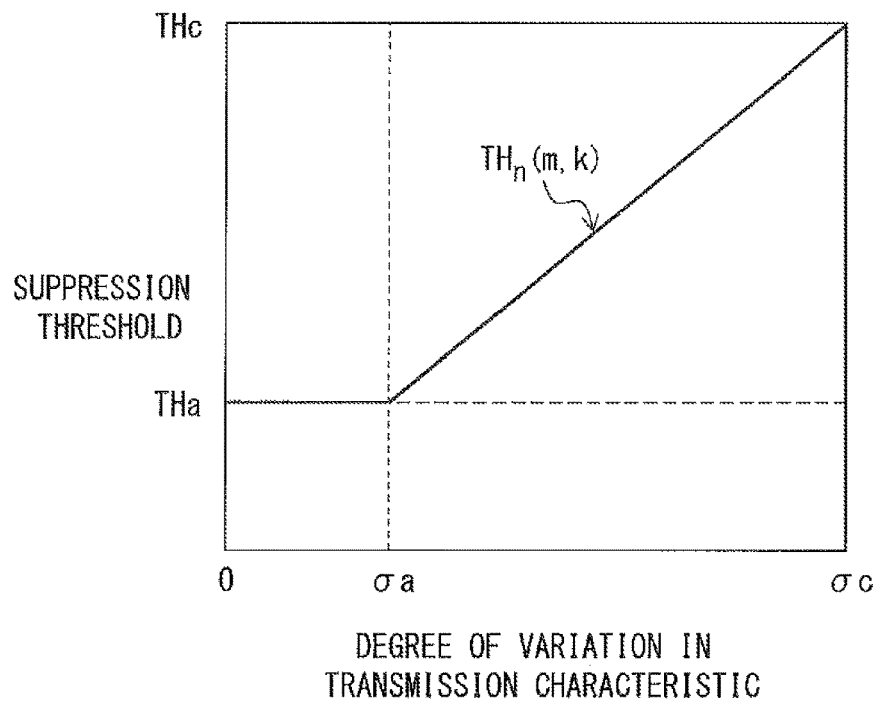
FIG. 10 is a diagram explaining a variation of a relationship between a degree of variation in a transmission characteristic and a suppression threshold.

In addition, as an example, in the process for calculating a suppression threshold $TH_n(m,k)$ (step S406), the suppression threshold $TH_n(m,k)$ may be a fixed value when a degree of variation in a transmission characteristic is smaller than or equal to a prescribed threshold, as illustrated in FIG. 10.

FIG. 10 is a diagram explaining a variation of a relationship between a degree of variation in a transmission characteristic and a suppression threshold.

In a case in which a suppression threshold $TH_n(m,k)$ is calculated according to expression (4) described above, as a degree $\sigma_n(m,k)$ of variation in a transmission characteristic decreases, the suppression threshold $TH_n(m,k)$ also decreases. Accordingly, in a band k in which the degree $\sigma_n(m,k)$ of variation in the transmission characteristic is small, a suppression range is reduced, and the transmission characteristic may exceed the suppression range. Therefore, in calculating the suppression threshold $TH_n(m,k)$, when the degree $\sigma_n(m,k)$ of variation in the transmission characteristic is smaller than or equal to the threshold σa, the suppression threshold $TH_n(m,k)$ may be calculated to be the fixed value THa. By doing this, a situation can be prevented in which suppression is not sufficiently performed because a suppression range is excessively small in a band k having a small degree $\sigma_n(m,k)$ of variation in a transmission characteristic and the transmission characteristic goes beyond the suppression range.

Second Embodiment

In this embodiment, an example is described in which sound signals collected by sound collection devices are transmitted to a sound processing device 1 by using a communication network such as the Internet and the sound signals are suppressed.

Figure 11:
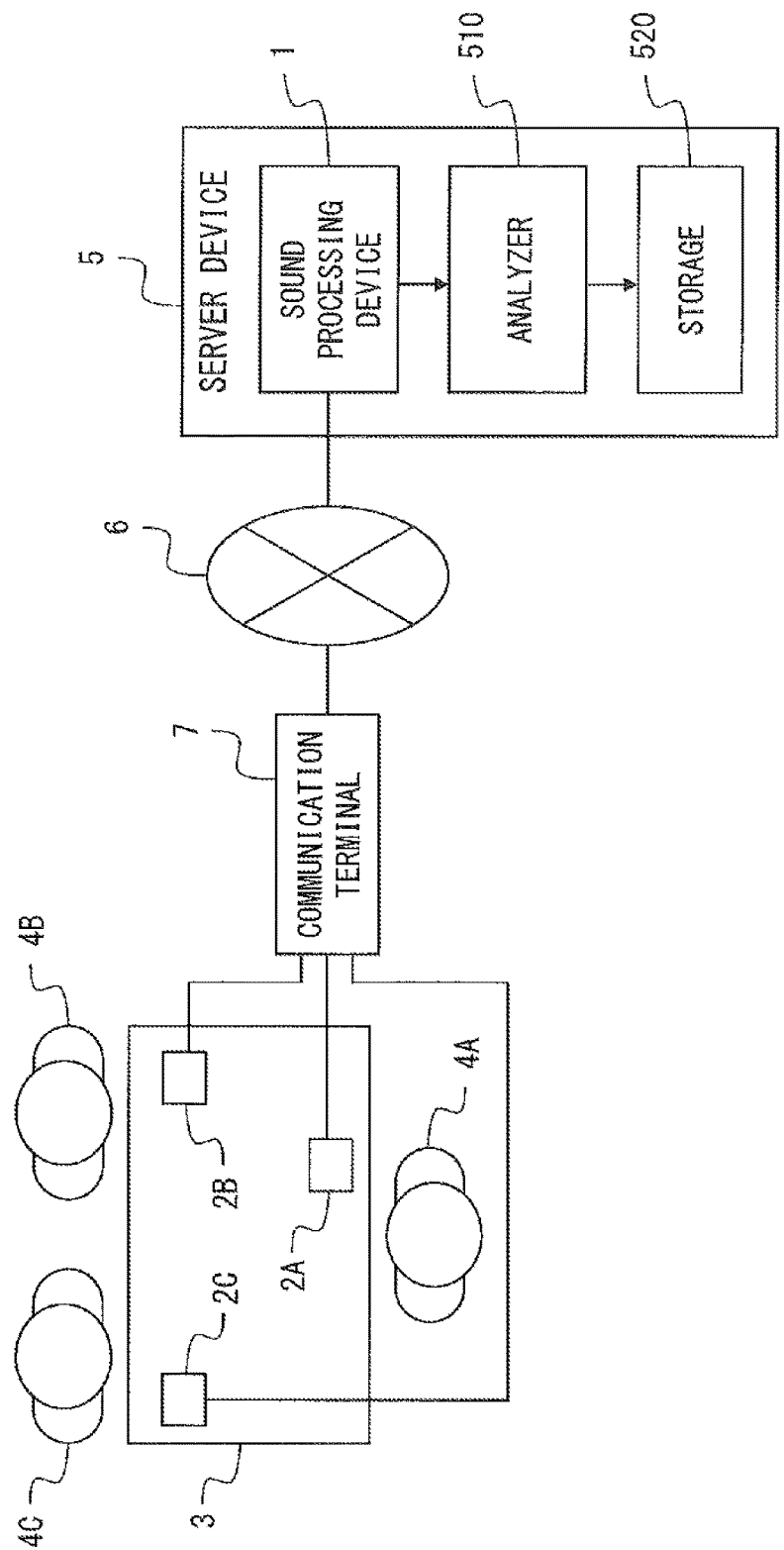
FIG. 11 illustrates an application example of a sound processing device according to a second embodiment.

FIG. 11 illustrates an application example of a sound processing device according to a second embodiment.

As illustrated in FIG. 11, the sound processing device 1 according to this embodiment is incorporated into a server device 5. The server device 5 includes an analyzer 510 and a storage 520 in addition to the sound processing device 1. The analyzer 510 performs sound analysis, for example, on a sound signal on which suppression processing is performed by the sound processing device 1, and parameterizes the sound signal. The storage 520 stores the sound signal on which suppression processing has been performed by the sound processing device 1, a result of analysis performed by the analyzer 510, and the like. The server device 5 is communicably connected to a network 6 such as the Internet.

Sound signals to be transmitted to the sound processing device 1 are collected by three sound collection devices 2A, 2B, and 2C. The three sound collection devices 2A, 2B, and 2C collect the sound of three persons 4A, 4B, and 4C that surround a table 3. Here, a first sound collection device 2A is provided near the first person 4A in order to collect the sound of the first person 4A. A second sound collection device 2B is provided near a second person 4B in order to collect the sound of the second person 4B. A third sound collection device 2C is provided near a third person 4C in order to collect the sound of the third person 4C. The first sound collection device 2A, the second sound collection device 2B, and the third sound collection device 2C are connected to a communication terminal 7. The communication terminal 7 converts the sound signal that is input from the sound collection device into a file in a prescribed file format, and transmits the file to the server device 5 via the network 6.

Figure 12:
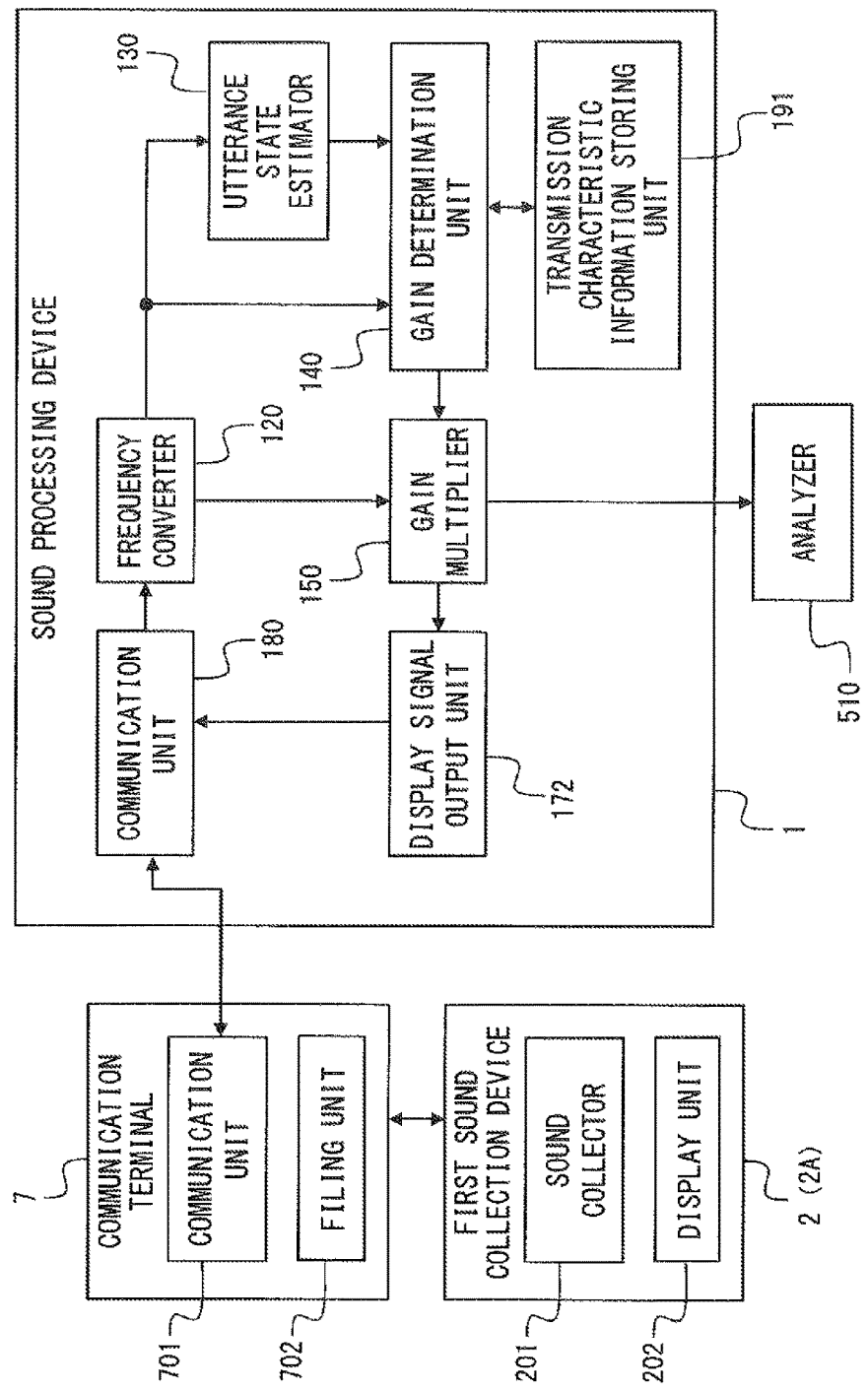
FIG. 12 illustrates a functional configuration of the sound processing device according to the second embodiment.

FIG. 12 illustrates a functional configuration of the sound processing device according to the second embodiment.

As illustrated in FIG. 12, the sound processing device 1 according to this embodiment includes a communication unit 180, a frequency converter 120, an utterance state estimator 130, a gain determination unit 140, a gain multiplier 150, and a display signal output unit 172. The sound processing device 1 further includes a transmission characteristic information storing unit 191.

The frequency converter 120, the utterance state estimator 130, the gain multiplier 150, and the display signal output unit 172 according to this embodiment respectively have the functions described in the first embodiment. The gain multiplier 150 outputs a frequency spectrum to which a gain has been multiplied to the display signal output unit 172 and the analyzer 510 of the server device 5. Namely, the sound processing device 1 according to this embodiment outputs the frequency spectrum to which a gain has been multiplied to the analyzer 510 in the form of a frequency spectrum.

The communication unit 180 communicably connects the sound processing device 1 to the network 6, and the communication unit 180 performs communication with various types of communication equipment including the communication terminal 7 via the network 6. The communication unit 180 transmits or receives a sound file and a display signal to/from a communication unit 701 of the communication terminal 7.

The communication terminal 7 obtains a sound signal collected by the sound collector 201 of the sound collection device 2, and converts the obtained sound signal into a file by using a filing unit 702. The communication unit 701 of the communication terminal 7 transmits the filed sound signal (a sound file) to the communication unit 180 of the sound processing device 1. In addition, the communication unit 701 of the communication terminal 7 receives a display signal to be transmitted to the display units 202 of the sound collection devices 2 by the communication unit 180 of the sound processing device 1, and transfers the display signal to the respective sound collection devices 2.

Figure 13:
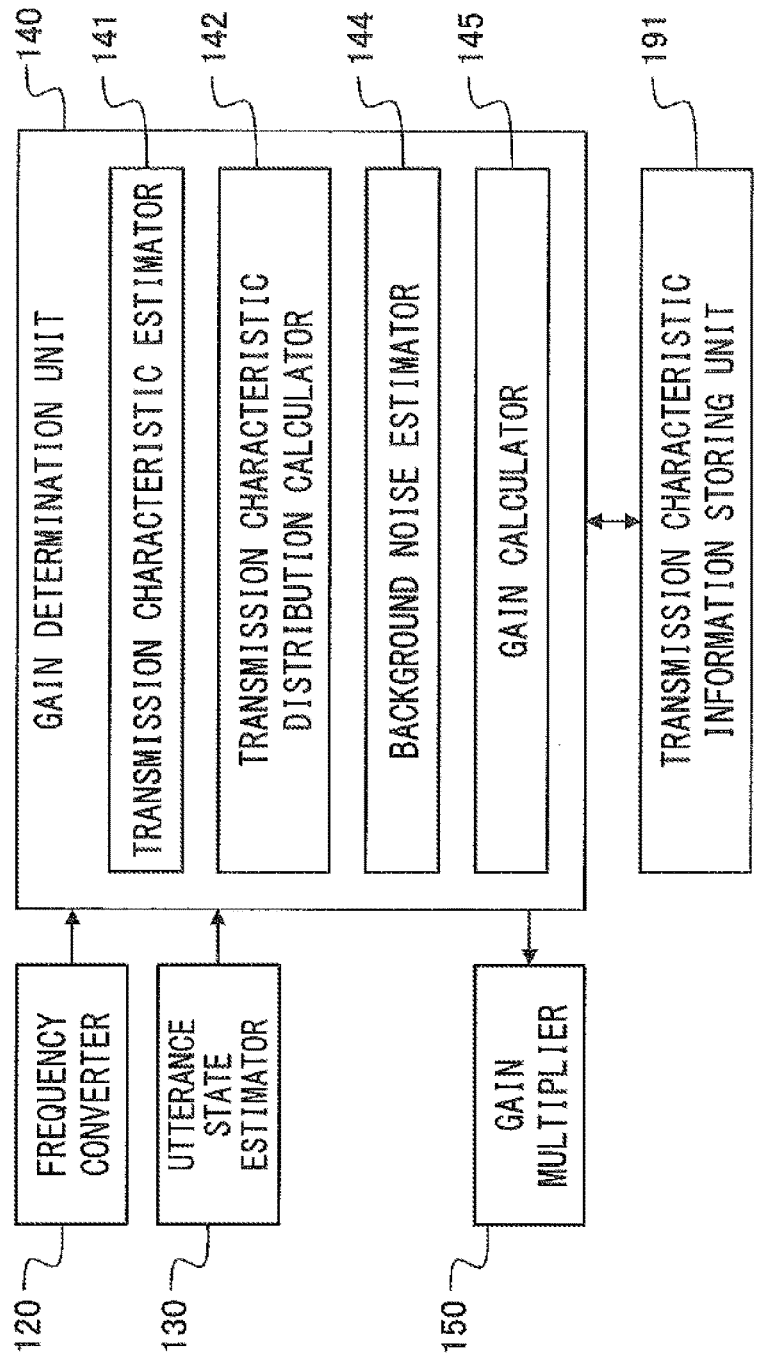
FIG. 13 illustrates the configuration of a gain determination unit in the sound processing device according to the second embodiment.

FIG. 13 illustrates the configuration of a gain determination unit in the sound processing device according to the second embodiment.

As illustrated in FIG. 13, the gain determination unit 140 according to this embodiment includes a transmission characteristic estimator 141, a transmission characteristic distribution calculator 142, a background noise estimator 144, and a gain calculator 145. The transmission characteristic estimator 141, the transmission characteristic distribution calculator 142, the background noise estimator 144, and the gain calculator 145 according to this embodiment respectively have the functions described in the first embodiment. Namely, the convergence determination unit 143 is omitted from the sound processing device 1 according to this embodiment.

After starting a process for obtaining a sound signal from the communication terminal 7, the sound processing device 1 according to this embodiment performs the processes of steps S1 to S5 and S7 to S9 illustrated in FIG. 4. In the process of step S7 that is performed by the sound processing device 1 according to this embodiment, a process for outputting a sound signal is performed by the gain multiplier 150. The gain multiplier 150 outputs a frequency spectrum $S_n(m,k)=G_n(m,k) \cdot X_n(m,k)$ to which a gain has been multiplied to the display signal output unit 172 and the analyzer 510.

Figure 14A:
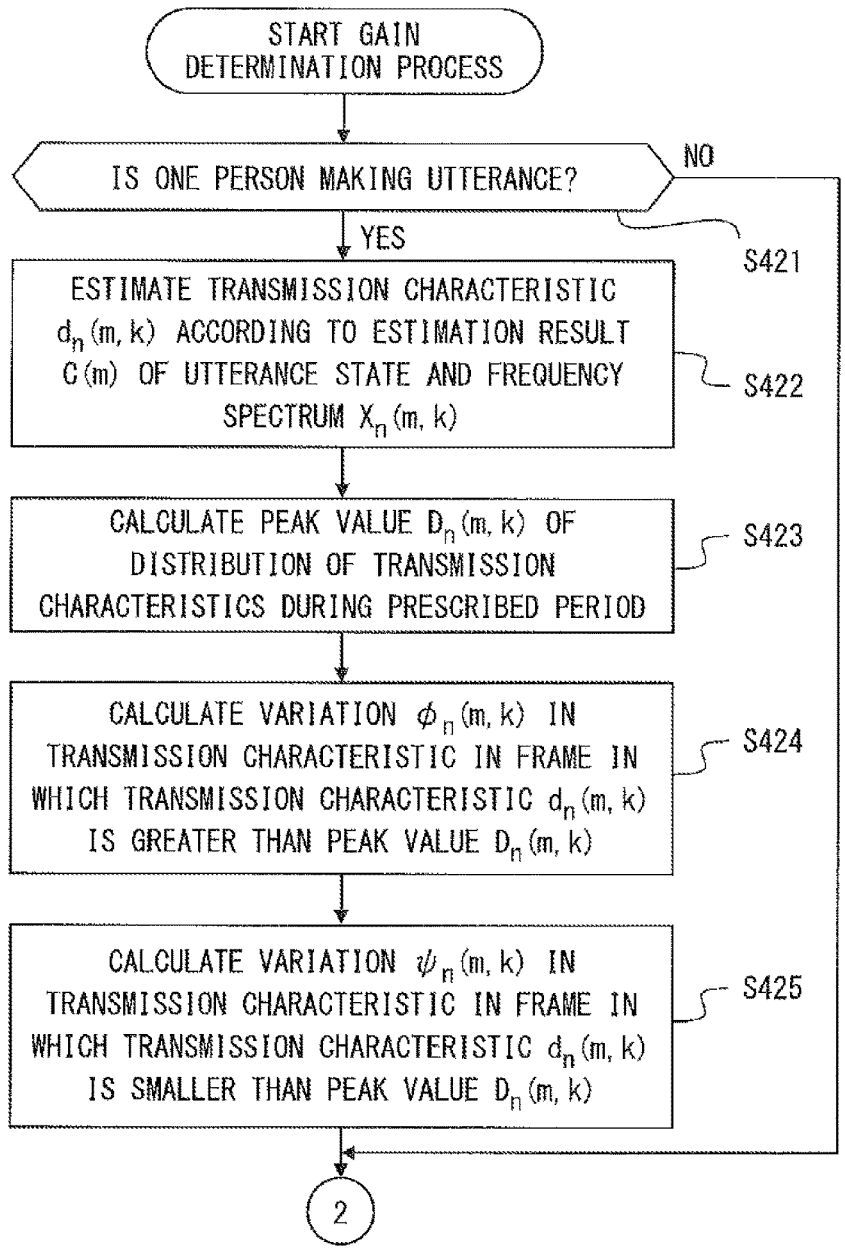
FIGS. 14A and 14B are a flowchart explaining the content of a gain determination process according to the second embodiment.
Figure 14B:
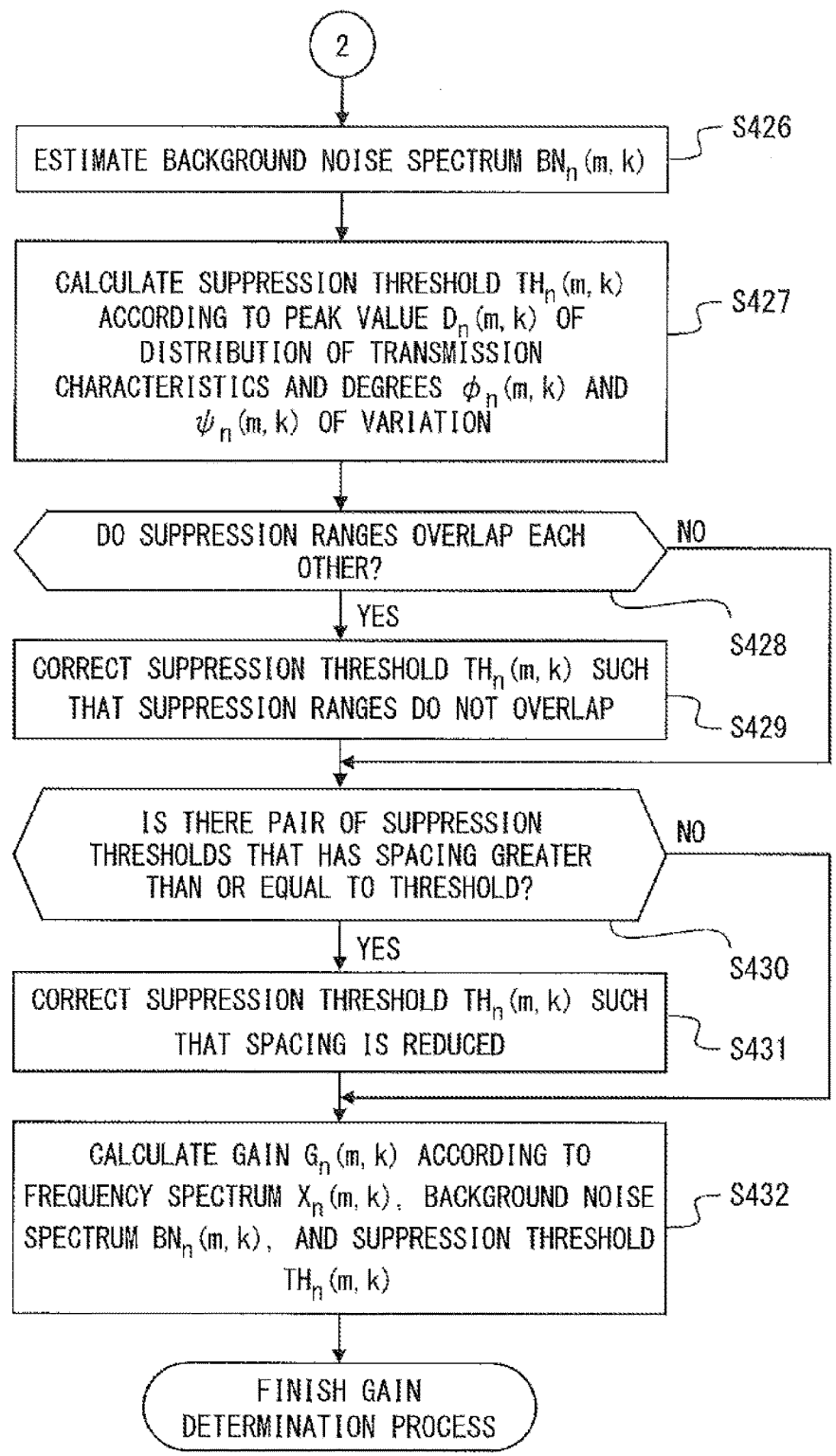

In addition, the gain determination unit 140 of the sound processing device 1 according to this embodiment performs the processing illustrated in FIGS. 14A and 14B as the gain determination process of step S4.

FIGS. 14A and 14B are a flowchart explaining the content of a gain determination process according to the second embodiment.

In the gain determination process according to this embodiment, the gain determination unit 140 first determines whether one person is making an utterance in accordance with an estimation result C(m) of an utterance state that has been received from the utterance state estimator 130 (step S421), as illustrated in FIG. 14A. The process of step S421 is performed by the transmission characteristic estimator 141.

When one person is making an utterance (step S421; YES), the transmission characteristic estimator 141 performs a process for estimating a transmission characteristic $d_n(m,k)$ in accordance with the estimation result C(m) of the utterance state and a frequency spectrum $X_n(m,k)$ (step S422). The process of step S422 that is performed by the transmission characteristic estimator 141 may be the same as the process of step S402 that has been described in the first embodiment. As an example, when there are three input sound signals and estimation result C(m) of utterance state is 1 (C(m)=1), the transmission characteristic estimator 141 calculates transmission characteristics $d_1(m,k)$, $d_2(m,k)$, and $d_3(m,k)$ according to expression (6-1) and expression (6-2) described below.

$$d_1(m,k)=X_1(m,k)-X_2(m,k) \quad (6\text{-}1)$$

$$d_2(m,k)=d_3(m,k)=\text{none} \quad (6\text{-}2)$$

As another example, when there are three input sound signals and estimation result C(m) of utterance state is 2 (C(m)=2), the transmission characteristic estimator 141 calculates transmission characteristics $d_1(m,k)$, $d_2(m,k)$, and $d_3(m,k)$ according to expression (6-3) and expression (6-4) described below.

$$d_1(m,k)=d_3(m,k)=\text{none} \quad (6\text{-}3)$$

$$d_2(m,k)=X_1(m,k)-X_2(m,k) \quad (6\text{-}4)$$

As yet another example, when there are three input sound signals and estimation result C(m) of utterance state is (C(m)=3), the transmission characteristic estimator 141 calculates transmission characteristics $d_1(m,k)$, $d_2(m,k)$, and $d_3(m,k)$ according to expression (6-5) and expression (6-6) described below.

$$d_1(m,k)=d_2(m,k)=\text{none} \quad (6\text{-}5)$$

$$d_3(m,k)=X_1(m,k)-X_3(m,k) \quad (6\text{-}6)$$

In expression (6-2), expression (6-3), and expression (6-5), "none" means that a transmission characteristic $d_n(m,k)$ is excluded from subsequent targets to be processed.

The transmission characteristic estimator 141 stores the estimated transmission characteristic $d_n(m,k)$ (n=0, 1, ..., N; k=0, 1, ..., T−1) in the transmission characteristic information storing unit 191.

Then, the gain determination unit 140 calculates a peak value $D_n(m,k)$ of the distribution of transmission characteristics during a prescribed period including the transmission characteristic $d_n(m,k)$ (step S423). The process of step S423 is performed by the transmission characteristic distribution calculator 142. The transmission characteristic distribution calculator 142 calculates the peak value $D_n(m,k)$ of the distribution, for example, according to expression (3-1) described above.

After calculating the peak value $D_n(m,k)$ of the distribution, the transmission characteristic distribution calculator 142 calculates a degree $\varphi_n(m,k)$ of variation in the transmission characteristic in a frame in which the transmission characteristic $d_n(m,k)$ is greater than the peak value $D_n(m,k)$ (Step S424). Further, the transmission characteristic distribution calculator 142 calculates a degree $\psi_n(m,k)$ of variation in the transmission characteristic in a frame in which the transmission characteristic $d_n(m,k)$ is smaller than the peak value $D_n(m,k)$ (Step S425). The transmission characteristic distribution calculator 142 calculates the degree $\varphi_n(m,k)$ of variation in the transmission characteristic according to expression (3-3) described below, and calculates the degree $\psi_n(m,k)$ of variation in the transmission characteristic according to expression (3-4) described below.

$$\phi_n(m,k) = \frac{1}{m0} \sum_{i=m-m0}^{m} |d_n(i,k) - D_n(i,k)| \ (d_n(i,k) > D_n(i,k)) \quad (3\text{-}3)$$

$$\psi_n(i,k) = \frac{1}{m0} \sum_{i=m-m0}^{m} |d_n(i,k) - D_n(i,k)| \ (d_n(i,k) < D_n(i,k)) \quad (3\text{-}4)$$

The gain determination unit 140 estimates a background noise spectrum $BN_n(m,k)$ according to the frequency spectrum $X_n(m,k)$, as illustrated in FIG. 14B (step S426). When there is not one person making an utterance (step S421; NO), the gain determination unit 140 skips the processes of steps S422 to S425, and performs the process of step S426. The process of step S426 is performed by the background noise estimator 144. The background noise estimator 144 estimates the background noise spectrum $BN_n(m,k)$ according to the frequency spectrum $X_n(m,k)$ by using a known estimation method. The background noise estimator 144 transfers the estimated background noise spectrum $BN_n(m,k)$ to the gain calculator 145.

The gain determination unit 140 calculates a suppression threshold $TH_n(m,k)$ according to a peak value $D_n(m,k)$ of the distribution of transmission characteristics and a degree $\sigma_n(m,k)$ of variation (step S427). The process of step S427 is performed by the gain calculator 145. The gain calculator 145 calculates suppression thresholds $TH\varphi_n(m,k)$ and $TH\psi_n(m,k)$ according to expression (7-1) and expression (7-2) described below.

$$TH\varphi_n(m,k)=D_n(m,k)+c(k)\cdot\sigma_n(m,k) \quad (7\text{-}1)$$

$$TH\psi_n(m,k)=D_n(m,k)-d(k)\cdot\sigma_n(m,k) \quad (7\text{-}2)$$

$c(k)$ in expression (7-1) and $d(k)$ in expression (7-2) are respective coefficients specified for each band k. The coefficients $c(k)$ and $d(k)$ may be values that are common to all of the bands k.

The gain calculator 145 determines whether suppression ranges specified by the calculated suppression thresholds $TH_n(m,k)$ overlap each other (Step S428). When the suppression ranges overlap each other (step S428; YES), the gain calculator 145 corrects the coefficients $c(k)$ and $d(k)$ of the suppression thresholds in such a way that the suppression ranges do not overlap each other (step S429).

After correcting the suppression thresholds $TH_n(m,k)$ in step S429, the gain determination unit 140 determines whether there is a pair of suppression thresholds that have a spacing greater than or equal to a threshold (step S430). When the suppression ranges do not overlap each other (step S428; NO), the gain calculator 145 skips step S429, and performs the determination of step S430. In step S430, the gain calculator 140 calculates the width of a section of transmission characteristics that are not included in the suppression ranges, for example, in accordance with the suppression thresholds $TH\varphi_n(m,k)$ and $TH\psi_n(m,k)$ of the band k. When a section for which the calculated width is greater than or equal to a threshold is detected (step S430; YES), the gain calculator 140 corrects the suppression thresholds in such a way that the spacing is reduced (step S431).

After correcting the suppression thresholds $TH_n(m,k)$ in step S431, the gain calculator 140 calculates a gain $G_n(m,k)$ according to the frequency spectrum $X_n(m,k)$, the background noise spectrum $BN_n(m,k)$, and the suppression thresholds $TH\varphi_n(m,k)$ and $TH\psi_n(m,k)$ (step S432).

The gain calculator 145 compares an absolute value of a level difference between a spectrum $X_n(m,k)$ and another spectrum $X_{n'}(m,k)$ associated with the spectrum $X_n(m,k)$ with suppression ranges defined by the suppression thresholds $TH\varphi_n(m,k)$ and $TH\psi_n(m,k)$, for each band k. Here, assume that a correspondence relationship between the spectrum $X_n(m,k)$ and the other spectrum $X_{n'}(m,k)$ is the same correspondence relationship as the correspondence relationship at the time of calculating the transmission characteristic. When the absolute value of the level difference between spectra is smaller than the suppression threshold $TH_n(m,k)$, the gain calculator 145 calculates a gain $G_n(m,k)$ to be multiplied to the spectrum $X_n(m,k)$ and a gain $G_{n'}(m,k)$ to be multiplied to the spectrum $X_{n'}(m,k)$.

As an example, when there are three input sound signals, the gain calculator 145 first determines for each band k whether a level difference between the spectrum $X_1(m,k)$ and the spectrum $X_2(m,k)$ is within suppression ranges defined by the suppression thresholds $TH\varphi_1(m,k)$ and $TH\psi_1(m,k)$. When a level difference between the spectrum $X_1(m,k)$ and the spectrum $X_2(m,k)$ is within the suppression ranges, the gain calculator 145 determines gains $G_n(m,k)$ according to expression (8-1) to expression (8-3) described below.

$$G_1(m,k)=1 \quad (8\text{-}1)$$

$$G_2(m,k)=BN_2(m,k)/X_2(m,k) \quad (8\text{-}2)$$

$$G_3(m,k)=BN_3(m,k)/X_3(m,k) \quad (8\text{-}3)$$

When the level difference between the spectrum $X_1(m,k)$ and the spectrum $X_2(m,k)$ is within suppression ranges defined by the suppression thresholds $TH\varphi_2(m,k)$ and $TH\psi_2(m,k)$, the gain calculator 145 determines gains $G_n(m,k)$ according to expression (8-4) to expression (8-6) described below.

$$G_n(m,k)=BN_1(m,k)/X_1(m,k) \quad (8\text{-}4)$$

$$G_2(m,k)=1 \quad (8\text{-}5)$$

$$G_3(m,k)=BN_3(m,k)/X_3(m,k) \quad (8\text{-}6)$$

Further, when a difference between the spectrum $X_1(m,k)$ and the spectrum $X_3(m,k)$ is within suppression ranges defined by the suppression thresholds $TH\varphi_3(m,k)$ and $TH\psi_3(m,k)$, the gain calculator 145 determines gains $G_n(m,k)$ according to expression (8-7) to expression (8-9) described below.

$$G_1(m,k)=BN_1(m,k)/X_1(m,k) \quad (8\text{-}7)$$

$$G_2(m,k)=BN_2(m,k)/X_2(m,k) \quad (8\text{-}8)$$

$$G_3(m,k)=1 \quad (8\text{-}9)$$

When the gain calculator 145 calculates all of the gains $G_n(m,k)$, and transfers the calculated gains $G_n(m,k)$ to the gain multiplier 150, the gain determination process is terminated.

After the gain determination process is terminated, the sound processing device 1 makes the gain multiplier 150 calculate a frequency spectrum $S_n(m,k)$ to which the gain $G_n(m,k)$ has been multiplied by using a known suppression method. The gain multiplier 150 outputs the calculated frequency spectrum $S_n(m,k)$ to the display signal output unit 172 and the analyzer 510. The display signal output unit 172 specifies a sound collection device 2 that is provided near a person making an utterance in accordance with the estimation result $C(m)$ of the utterance state and a gain $G_n(m,k)$ applied to the frequency spectrum $X_n(m,k)$, and outputs a signal to the display unit 202 of the specified sound collection device 2 to display the display unit 202. The display signal that is output by the display signal output unit 172 is transmitted from the communication unit 180 via the network 6 to the communication terminal 7. The communication terminal 7 transfers the received display signal to a prescribed sound collection device 2 to display the display unit 202.

As described above, in the gain determination process according to this embodiment, a suppression threshold $TH_n(m,k)$ is calculated for each band k in accordance with a peak value $D_n(m,k)$ of the distribution of transmission characteristics and a degree $\sigma_n(m,k)$ of variation in the transmission characteristic during a prescribed period. At this time, the gain determination unit 140 calculates the suppression thresholds $TH_n(m,k)$ in such a way that a suppression range of a band having a large degree $\sigma_n(m,k)$ of variation is wider than a suppression range of a band having a small degree $\sigma_n(m,k)$ of variation. Therefore, suppression can be prevented from being insufficiently performed in sound processing for suppressing an input signal spectrum $X_n(m,k)$ when the transmission characteristic is within the suppression ranges. Thus, according to this embodiment, the sound of each person in sound signals obtained by collecting a conversation among a plurality of persons can be accurately separated.

In addition, in the gain determination process according to this embodiment, the degree $\varphi_n(m,k)$ of variation in a section in which a transmission characteristic is greater than a peak value $D_n(m,k)$ and the degree $\psi_n(m,k)$ of variation in a section in which the transmission characteristic is smaller than the peak value $D_n(m,k)$ are individually calculated. Then, suppression ranges are specified according to suppression thresholds calculated according to the respective degrees $\varphi_n(m,k)$ and $\psi_n(m,k)$ of variation.

Figure 15A:
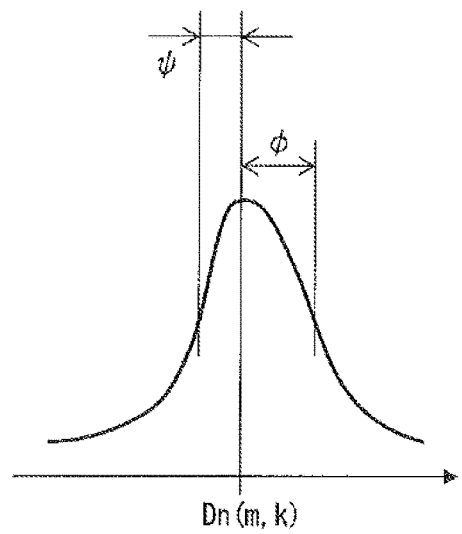
FIGS. 15A and 15B are diagrams explaining a method for calculating a suppression threshold according to the second embodiment.
Figure 15B:
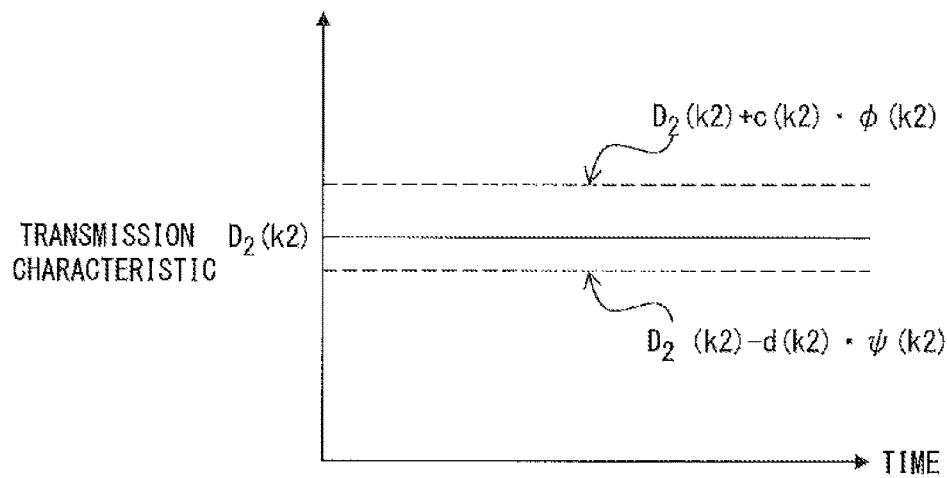

FIGS. 15A and 15B are diagrams explaining a method for calculating a suppression threshold according to the second embodiment.

FIG. 15A illustrates the distribution of transmission characteristics in a simplified form of the histogram of FIG. 6A illustrating the distribution of transmission characteristics. In the distribution of transmission characteristics, the degree $\varphi$ of variation in a section in which the transmission characteristic is greater than a peak value $D_n(m,k)$ may be different from the degree $\psi$ of variation in a section in which the transmission characteristic is smaller than the peak value $D_n(m,k)$, as illustrated in FIG. 15A, for example. In the distribution of transmission characteristics illustrated in FIG. 15A, the number of cases in which the transmission characteristic is greater than the peak value $D_n(m,k)$ is larger than the number of cases in which the transmission characteristic is smaller than the peak value $D_n(m,k)$. Accordingly, in calculating suppression thresholds $TH_n(m,k)$, it is preferable that a suppression range for a transmission characteristic greater than the peak value $D_2(m,k2)$ be wider than a suppression range for a transmission characteristic smaller than the peak value $D_2(m,k)$, as illustrated in FIG. 15B. Consequently, more appropriate suppression ranges according to the distribution of transmission characteristics can be specified. FIG. 15B illustrates suppression thresholds in a case in which band $k=k2$, but suppression thresholds are similarly specified according to the distribution of transmission characteristics for another band k. In this case, of course, suppression ranges for each of the bands may include both a band in which a section in which the transmission characteristic is greater than the peak value $D_n(m,k)$ is wider and a band in which a section in which the transmission characteristic is smaller than the peak value $D_n(m,k)$ is wider.

Further, in the gain determination process according to this embodiment, when suppression ranges that are respectively defined by the suppression thresholds $TH\varphi_n(m,k)$ and $TH\psi_n(m,k)$ overlap each other, values of the suppression thresholds $TH\varphi_n(m,k)$ and $TH\psi_n(m,k)$ are corrected such that the suppression ranges do not overlap each other.

FIGS. 16A and 16B are diagrams explaining a correction method in a case in which suppression ranges overlap each other.

FIG. 16A illustrates the peak value $D_1$ of transmission characteristics and the suppression threshold $TH\varphi_1$ for the frequency spectrum $X_1(m,k)$, and the peak value $D_2$ of transmission characteristics and the suppression thresholds $TH\varphi_2$ and $TH\psi_2$ for the frequency spectrum $X_2(m,k)$, in a certain band. In FIG. 16A, a magnitude relationship between the suppression threshold $TH\varphi_1(m,k)$ on an upper-limit side for the frequency spectrum $X_1(m,k)$ and the suppression threshold $TH\psi_2(m,k)$ on a lower-limit side for the frequency spectrum $X_2(m,k)$ is $TH\varphi_1(m,k)>TH\psi_2(m,k)$. Namely, a suppression range for the frequency spectrum $X_1(m,k)$ overlaps a suppression range for the frequency spectrum $X_2(m,k)$. When suppression ranges overlap each other, as described above, as an example, an erroneous determination may be performed in calculating the gains $G_1(m,k)$ and $G_2(m,k)$ to be multiplied, and an erroneous suppression may be performed.

Accordingly, in the gain determination process according to this embodiment, when suppression ranges overlap each other, suppression thresholds are corrected in such a way that the suppression ranges do not overlap each other. Namely, as illustrated in FIG. 16B, correction is performed in such a way that the magnitude relationship between the suppression threshold $TH\varphi_1(m,k)$ on the upper-limit side for the frequency spectrum $X_1(m,k)$ and the suppression threshold $TH\psi_2(m,k)$ of the lower-limit side for the frequency spectrum $X_2(m,k)$ is $TH\varphi_1(m,k)<TH\psi_2(m,k)$. Consequently, an inappropriate suppression due to an overlap of suppression ranges can be prevented. A method for correcting the suppression thresholds $TH\varphi_1(m,k)$ and $TH\psi_2(m,k)$ can be appropriately specified. Only one of the suppression thresholds $TH\varphi_1(m,k)$ and $TH\psi_2(m,k)$ may be corrected, or both of the suppression thresholds $TH\varphi_1(m,k)$ and $TH\psi_2(m,k)$ may be corrected.

In addition, in the gain determination process according to this embodiment, when a spacing between suppression ranges defined by suppression thresholds $TH\varphi n(m,k)$ and $TH\psi_n(m,k)$ are greater than or equal to a threshold, values of the suppression thresholds $TH\varphi_n(m,k)$ and $TH\psi_n(m,k)$ are corrected in such a way that the spacing is reduced. By doing this, suppression can be prevented from being insufficiently performed due to the existence of transmission characteristics that are not within the suppression ranges.

The respective flowcharts of FIGS. 14A and 14B are examples of the gain determination process performed by the sound processing device 1 according to this embodiment. The content of the gain determination process performed by the sound processing device 1 according to this embodiment is not limited to the content illustrated in FIGS. 14A and 14B, and can be appropriately changed without departing from the gist of this embodiment.

The sound processing device 1 described in the embodiments above can be implemented, for example, by a computer and a program executed by the computer. The sound processing device 1 that is implemented by the computer and the program is described below with reference to FIG. 17.

FIG. 17 illustrates a hardware configuration of the computer.

As illustrated in FIG. 17, a computer 15 includes a processor 1501, a main storage 1502, an auxiliary storage 1503, an input device 1504, an output device 1505, an input/output interface 1506, a communication control device 1507, and a medium driving device 1508. These components 1501 to 1508 in the computer 15 are mutually connected via a bus 1510, and data can be communicated among these components.

The processor 1501 is a central processing unit (CPU), a micro processing unit (MPU), or the like. The processor 1501 controls the entire operation of the computer 15 by executing various programs including an operating system. In addition, the processor 1501 performs, for example, the respective processes illustrated in FIG. 4 and FIG. 5. Further, the processor 1501 can perform the respective processes illustrated in FIGS. 14A and 14B instead of the respective processes illustrated in FIG. 5.

The main storage 1502 includes a read-only memory (ROM) and a random access memory (RAM) that are not illustrated. As an example, a prescribed basic control program that is read by the processor 1501 when the computer 15 is started is recorded in advance in the ROM of the main storage 1502. The processor 1501 uses the RAM of the main storage 1502 as a working storage area as needed when executing various programs. The RAM of the main storage 1502 can be used, for example, as the transmission characteristic information storing unit 191 in the sound processing device 1 illustrated in FIG. 1. In addition to the usage as the transmission characteristic information storing unit 191, the RAM of the main storage 1502 can be used to store an input sound signal, a frequency spectrum, various types of information that are calculated in a process for determining a gain, and the like.

The auxiliary storage 1503 is, for example, a non-volatile memory (including a solid state drive (SSD)) such as a hard disk drive (HDD) or a flash memory, and the auxiliary storage 1503 is a storage that has a larger capacity than the RAM of the main storage 1502. The auxiliary storage 1503 can be used to store various programs, various types of data, and the like that are executed by the processor 1501. The auxiliary storage 1503 can be used to store, for example, a program including the respective processes illustrated in FIG. 4 and FIG. 5. In addition, the auxiliary storage 1503 can be used, for example, as the sound file storage 192, and also can be used to store an input sound signal, a frequency spectrum, and the like.

The input device 1504 is, for example, a keyboard device or a touch panel device. When an operator (a user) of the computer 15 performs a prescribed operation on the input device 1504, the input device 1504 transmits input information associated with the content of the operation to the processor 1501. The input device 1504 can be used, for example, to input an instruction to start recording a conversation, an instruction relating to another process that can be performed by the computer 15, or other instructions, or to input various setting values.

Examples of the output device 1505 include a device such as a liquid-crystal display device, and a sound reproduction device such as a speaker.

The input/output interface 1506 connects the computer 15 and another electronic device. The input/output interface 1506 includes, for example, a connector of the universal serial bus (USB) standard. The input/output interface 1506 can be used to connect, for example, the computer 15 and the sound collection device 2.

The communication control device 1507 is a device that connects the computer 15 to a network such as the Internet and that controls various types of communication between the computer 15 and another electronic device via the network. The communication control device 1507 can be used for communication between the computer 15 and the communication terminal 7 that converts a sound signal collected by a sound collection device into a sound file and transmits the sound file to the computer 15.

The medium driving device 1508 reads a program or data that is recorded in a portable storage medium 16, and writes data or the like that is stored in the auxiliary storage 1503 to the portable storage medium 16. As the medium driving device 1508, a reader/writer for a memory card that conforms to one or more types of standards can be used, for example. When the reader/writer for a memory card is used as the medium driving device 1508, a memory card (a flash memory) of a standard that the reader/writer for a memory card conforms to, such as the secure digital (SD) standard, can be used, for example, as the portable storage medium 16. In addition, a flash memory including a connector of the USB standard can be used, for example, as the portable storage medium 16. Further, when the computer 15 is mounted with an optical disk drive that can be used as the medium driving device 1508, various optical disks that can be recognized by the optical disk drive can be used as the portable storage medium 16. Examples of an optical disk that can be used as the portable storage medium 16 include a compact disc (CD), a digital versatile disc (DVD), and a Blu-ray disc (Blu-ray is a registered trademark). The portable storage medium 16 can be used to store a program including the processes illustrated in FIG. 4 and FIG. 5, an input sound signal, a sound signal that is suppressed by multiplying a gain, and the like.

When an operator inputs an instruction to start recording a conversation to the computer 15 by using the input device 1504 or the like, the processor 1501 reads and executes a sound processing program that is stored in a non-transitory recording medium such as the auxiliary storage 1503. In this process, the processor 1501 functions (operates) as the input receiver 110, the frequency converter 120, the utterance state estimator 130, the gain determination unit 140, the gain multiplier 150, the inverse converter 160 in the sound processing device 1, and the like. In addition, the RAM of the main storage 1502, the auxiliary storage 1503, and the like function as a storage that stores an input sound signal, a frequency spectrum, and the like, in addition to the transmission characteristic information storing unit 191 and the sound data storage 192 in the sound processing device 1.

The computer 15 that operates as the sound processing device 1 does not need to include all of the components 1501 to 1508 illustrated in FIG. 17, and some of the components can be omitted according to applications or conditions. As an example, the medium driving device 1508 may be omitted from the computer 15.

In the aspect above, a sound signal can be appropriately suppressed according to a transmission characteristic.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A non-transitory computer-readable recording medium having stored therein a sound processing program that causes a computer to execute a sound process, the sound process comprising:
obtaining a first sound signal collected by a first microphone and a second sound signal collected by a second microphone;

obtaining a first frequency spectrum that corresponds to the first sound signal and a second frequency spectrum that corresponds to the second sound signal;

calculating a level difference between a level of each of frequency components in the first frequency spectrum and a level of each of frequency components in the second frequency spectrum;

calculating a spread of a distribution of the level difference during a prescribed period for each of the frequency components;

determining a gain to be multiplied to the frequency component in the first frequency spectrum and a gain to be multiplied to the frequency component in the second frequency spectrum in accordance with the spread of the distribution of the level difference;

multiplying the frequency components in each of the first and second frequency spectra by the determined gain and converting the first and second frequency spectra after the multiplication by the gain respectively into a first sound output signal of a time domain and a second sound output signal of the time domain; and storing the first and second sound output signals in a sound file storage.

2. The non-transitory computer-readable recording medium according to claim 1, wherein
the determining the gain includes:
specifying a suppression threshold indicating a range in which the gain is multiplied in accordance with the spread of the distribution of the level difference for each of the frequency components in the first frequency spectrum; and
specifying a suppression threshold indicating a range in which the gain is multiplied in accordance with the spread of the distribution of the level difference for each of the frequency components in the second frequency spectrum.

3. The non-transitory computer-readable recording medium according to claim 1, wherein
the calculating the spread of the distribution of the level difference is a process for calculating a degree of variation in the level difference.

4. The non-transitory computer-readable recording medium according to claim 3, wherein
the calculating the degree of variation in the level difference is a process for calculating a degree of dispersion for the distribution of the level difference.

5. The non-transitory computer-readable recording medium according to claim 1, wherein
the calculating the spread of the distribution of the level difference includes:
calculating a peak value of the distribution of the level difference during the prescribed period; and
calculating the spread of the distribution of the level difference in accordance with a temporal change in the peak value, the level difference, or both thereof.

6. The non-transitory computer-readable recording medium according to claim 1, wherein
the calculating the spread of the distribution of the level difference includes:
calculating a peak value of the distribution of the level difference during the prescribed period; and
calculating a first spread in accordance with the distribution of the level difference greater than the peak value, and calculating a second spread in accordance with the distribution of the level difference smaller than the peak value.

7. The non-transitory computer-readable recording medium according to claim 1, wherein
the determining the gain includes:
calculating a suppression threshold in accordance with one of a sum of and a difference between a peak value of the distribution of the level difference during the prescribed period and a value obtained by multiplying a value indicating the spread of the distribution of the level difference by a constant; and
determining the gain to be multiplied to the frequency component in the first frequency spectrum and the gain to be multiplied to the frequency component in the second frequency spectrum in accordance with whether the level difference is within a range specified by the suppression threshold.

8. The non-transitory computer-readable recording medium according to claim 2, wherein
the determining the gain includes:
correcting the suppression threshold when, in one frequency component, a range in which the gain specified according to the suppression threshold for the first frequency spectrum is multiplied overlaps a range in which the gain specified according to the suppression threshold for the second frequency spectrum is multiplied.

9. The non-transitory computer-readable recording medium according to claim 2, wherein
the determining the gain includes:
correcting the suppression threshold when, in one frequency component, a spacing between a range in which the gain specified according to the suppression threshold for the first frequency spectrum is multiplied and a range in which the gain specified according to the suppression threshold for the second frequency spectrum is greater than or equal to a threshold.

10. The non-transitory computer-readable recording medium according to claim 1, the sound process further comprising:
determining whether a temporal change in a peak value of the distribution of the level difference during the prescribed period and a temporal change in the spread of the distribution of the level difference have been converged, wherein
the determining the gain is a process for determining a gain to be multiplied to the frequency component in the first spectrum and a gain to be multiplied to the frequency component in the second frequency spectrum when the temporal change in the peak value of the distribution of the level difference and the temporal change in the spread of the distribution of the level difference have been converged.

11. The non-transitory computer-readable recording medium according to claim 1, the sound process further comprising:
estimating an utterance state of the sound signals in accordance with the first frequency spectrum and the second frequency spectrum, wherein
the calculating the spread of the level difference is a process for calculating the spread of the level difference when an estimation result of the utterance state is a state in which one person is making an utterance.

12. The non-transitory computer-readable recording medium according to claim 1, the sound process further comprising:

calculating a first background noise spectrum for the first frequency spectrum and a second background noise spectrum for the second frequency spectrum, wherein the determining the gain is a process for calculating the gain to be multiplied to the first frequency spectrum in accordance with the first frequency spectrum and the first background noise spectrum, and calculating the gain to be multiplied to the second frequency spectrum in accordance with the second frequency spectrum and the second background noise spectrum.

13. The non-transitory computer-readable recording medium according to claim 1, wherein the obtaining the frequency spectrum is a process for obtaining three or more frequency spectra that respectively correspond to three or more sound signals including the first sound signal and the second sound signal, and the determining the gain is a process for determining gains to be multiplied to respective frequency components in the three or more frequency spectra in accordance with the spread of the distribution of the level difference for a pair of the first frequency spectrum and the second frequency spectrum that are selected from the three or more frequency spectra, and the level difference for the pair of the first frequency spectrum and the second frequency spectrum.

14. A sound processing device comprising:

a processor that performs:

obtaining a first sound signal collected by a first microphone and a second sound signal collected by a second microphone;

obtaining a first frequency spectrum that corresponds to the first sound signal and a second frequency spectrum that corresponds to the second sound signal;

calculating a level difference between a level of each of frequency components in the first frequency spectrum and a level of each of frequency components in the second frequency spectrum;

calculating a spread of a distribution of the level difference during a prescribed period for each of the frequency components;

determining a gain to be multiplied to the frequency component in the first frequency spectrum and a gain to be multiplied to the frequency component in the second frequency spectrum in accordance with the spread of the distribution of the level difference;

multiplying the frequency components in each of the first and second frequency spectra by the determined gain and converting the first and second frequency spectra after the multiplication by the gain respectively into a first sound output signal of a time domain and a second sound output signal of the time domain; and storing the first and second sound output signals in a sound file storage.

15. The sound processing device according to claim 14, wherein the processor performs:

estimating an utterance state of the first sound signal and the second sound signal in accordance with the first frequency spectrum and the second frequency spectrum; and calculating the spread of the level difference when the utterance state is a state in which one person is making an utterance.

16. The sound processing device according to claim 14, wherein the processor performs:

calculating a first background noise spectrum for the first frequency spectrum and a second background noise spectrum for the second frequency spectrum; and calculating the gain to be multiplied to the first frequency spectrum in accordance with the first frequency spectrum and the first background noise spectrum, and calculating the gain to be multiplied to the second frequency spectrum in accordance with the second frequency spectrum and the second background noise spectrum.

17. The sound processing device according to claim 14, wherein the processor performs:

determining whether a temporal change in a peak value of the distribution of the level difference during the prescribed period and a temporal change in the spread of the distribution of the level difference have been converged; and calculating the gain to be multiplied to the first frequency spectrum and the gain to be multiplied to the second frequency spectrum when the temporal change in the peak value of the distribution of the level difference and the temporal change in the spread of the distribution of the level difference have been converged.

18. A sound processing method comprising:

obtaining, by a computer, a first sound signal collected by a first microphone and a second sound signal collected by a second microphone;

obtaining, by the computer, a first frequency spectrum that corresponds to the first sound signal and a second frequency spectrum that corresponds to the second sound signal;

calculating, by the computer, a level difference between a level of each of frequency components in the first frequency spectrum and a level of each of frequency components in the second frequency spectrum;

calculating, by the computer, a spread of a distribution of the level difference during a prescribed period for each of the frequency components;

determining, by the computer, a gain to be multiplied to the frequency component in the first frequency spectrum and a gain to be multiplied to the frequency component in the second frequency spectrum in accordance with the spread of the distribution of the level difference;

multiplying, by the computer, the frequency components in each of the first and second frequency spectra by the determined gain and converting the first and second frequency spectra after the multiplication by the gain respectively into a first sound output signal of a time domain and a second sound output signal of the time domain; and storing, by the computer, the first and second sound output signals in a sound file storage.

19. The non-transitory computer-readable recording medium according to claim 1, the sound process further comprising:

in accordance with the first frequency spectrum and the second frequency spectrum, making an estimation as to which of a state in which there are no persons making an utterance, a state in which only one person is making an utterance, or a state in which two persons making an utterance an utterance state of the sound signals is, wherein the calculating the spread of the level difference is a process for calculating the spread of the level difference when an estimation result of the utterance state is a state in which only one person is making an utterance.

* * * * *